United States Patent
Lee et al.

(10) Patent No.: US 11,659,715 B2
(45) Date of Patent: *May 23, 2023

(54) SEMICONDUCTOR MEMORY DEVICE AND METHOD OF OPERATING THE SEMICONDUCTOR MEMORY DEVICE

(71) Applicant: SK hynix Inc., Icheon-si (KR)

(72) Inventors: Kun Young Lee, Seoul (KR); Sun Young Kim, Andong-si (KR); Jae Gil Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/561,471

(22) Filed: Dec. 23, 2021

(65) Prior Publication Data

US 2022/0115404 A1 Apr. 14, 2022

Related U.S. Application Data

(63) Continuation of application No. 16/888,057, filed on May 29, 2020, now Pat. No. 11,244,960.

(30) Foreign Application Priority Data

Oct. 11, 2019 (KR) .................. 10-2019-0126163

(51) Int. Cl.
*H01L 27/11597* (2017.01)
*H01L 27/1159* (2017.01)

(52) U.S. Cl.
CPC .... *H01L 27/11597* (2013.01); *H01L 27/1159* (2013.01)

(58) Field of Classification Search
CPC ........... H01L 27/11597; H01L 27/1159; H01L 27/11582; H01L 27/11556; H01L 27/11568; G11C 11/223; G11C 11/5657; G11C 11/5671; G11C 16/0466; G11C 16/10
USPC .......................................... 365/145
See application file for complete search history.

(56) References Cited

U.S. PATENT DOCUMENTS

2020/0020704 A1* 1/2020 Dong ................ H01L 29/40111
2020/0321444 A1 10/2020 Lien et al.
2021/0050359 A1* 2/2021 Kai .................. H01L 27/11597

FOREIGN PATENT DOCUMENTS

KR 101495806 B1 2/2015
KR 101872122 B1 6/2018

OTHER PUBLICATIONS

Daesu Lee et al., "Multilevel Data Storage Memory Using Deterministic Polarization Control", Advanced Materials, 2012, pp. 402-406.

* cited by examiner

*Primary Examiner* — Fernando Hidalgo
(74) *Attorney, Agent, or Firm* — William Park & Associates Ltd.

(57) ABSTRACT

The present technology includes a semiconductor memory device. The semiconductor memory device includes a stack including a conductive pattern and an insulating pattern, a channel structure penetrating the stack, and a memory pattern between the conductive pattern and the channel structure. The memory pattern includes a blocking pattern, a tunnel pattern, a storage pattern, and a ferroelectric pattern.

14 Claims, 16 Drawing Sheets

SEMICONDUCTOR MEMORY DEVICE AND METHOD OF OPERATING THE SEMICONDUCTOR MEMORY DEVICE

CROSS-REFERENCE TO RELATED APPLICATION

The present application is a continuation application of U.S. patent application Ser. No. 16/888,057, filed on May 29, 2020, and claims priority under 35 U.S.C. § 119(a) to Korean patent application number 10-2019-0126163 filed on Oct. 11, 2019, the entire disclosure of which is incorporated herein by reference.

BACKGROUND

1. Technical Field

The present disclosure generally relates to a semiconductor memory device and a method of operating the semiconductor memory device, and more particularly, to a three-dimensional semiconductor memory device and a method of operating the three-dimensional semiconductor memory device.

2. Related Art

A semiconductor memory device includes memory cells capable of storing data.

According to a method of storing and maintaining data, the semiconductor memory device may be classified into a volatile semiconductor memory device and a non-volatile semiconductor memory device. The volatile semiconductor memory device is a memory device in which stored data is lost when power supply is interrupted, and the non-volatile semiconductor memory device is a memory device in which stored data is maintained even though power supply is interrupted.

Recently, as the use of a portable electronic device increases, the use of the non-volatile semiconductor memory device increases, and high integration and large capacity of the semiconductor memory device are required for portability and large capacity. For such high integration and large capacity, a three-dimensional semiconductor memory device has been proposed.

SUMMARY

A semiconductor memory device according to an embodiment of the present disclosure may include a stack including a conductive pattern and an insulating pattern, a channel structure penetrating the stack, and a memory pattern between the conductive pattern and the channel structure. The memory pattern may include a blocking pattern that is in contact with the conductive pattern, a tunnel pattern that is in contact with the channel structure, a storage pattern between the blocking pattern and the tunnel pattern, and a ferroelectric pattern between the blocking pattern and the tunnel pattern.

A semiconductor memory device according to an embodiment of the present disclosure may include a stack including a conductive pattern and an insulating pattern, a channel structure penetrating the stack, and a memory pattern between the conductive pattern and the channel structure. The memory pattern may include ferroelectric patterns spaced apart from each other, and a storage pattern between the ferroelectric patterns.

A semiconductor memory device according to an embodiment of the present disclosure may include a stack including a through hole and a recess connected to the through hole, a blocking film covering surfaces of the stack defining the through hole and the recess, a tunnel film in the blocking film, a channel structure in the tunnel film, and a memory pattern disposed between the blocking film and the tunnel film in the recess. The memory pattern may include a storage pattern and a ferroelectric pattern.

A method of operating a semiconductor memory device according to an embodiment of the present disclosure, in a program operation of a memory cell including a conductive pattern, a channel structure, and a storage pattern and a ferroelectric pattern, which includes a plurality of domains having different crystal structures, between the conductive pattern and the channel structure, may include applying a program voltage to the conductive pattern so that a charge is trapped in the storage pattern, and applying a polarization change voltage to the conductive pattern so that the ferroelectric pattern has various polarization orientations.

A method of operating a semiconductor memory device according to an embodiment of the present disclosure, in a program operation of a memory cell including a conductive pattern, a channel structure, and a storage pattern and a ferroelectric pattern, which includes first and second domains having different crystal structures, between the conductive pattern and the channel structure, may include applying a program voltage to the conductive pattern so that a charge is trapped in the storage pattern, and applying a first polarization change voltage to the conductive pattern to change a polarization orientation of the first and second domains.

DETAILED DESCRIPTION

The technical spirit of the present disclosure may be variously changed and may be configured with embodiments having various aspects. Hereinafter, some embodiments of the present disclosure will be described in order to facilitate a person skilled in the art to which the present disclosure pertains to easily carry out the technical spirit of the present disclosure.

In some embodiments, when a pattern, film or structure is referred to as being 'in contact with' another pattern, film, or structure, it can be directly in contact with the other pattern, film, or structure without any intervening patterns, films, or structures present. In other embodiments, when a pattern, film, or structure is referred to as being 'indirectly in contact with' another pattern, film, or structure, there may be intervening patterns, films, or structures between the pattern, film, or structure and the other pattern, film, or structure.

Embodiments of the present disclosure may provide a semiconductor memory device capable of improving operation reliability.

In the semiconductor memory devices according to the various embodiments of the present technology, the memory pattern may include the ferroelectric pattern and the storage pattern. Therefore, operation reliability of the semiconductor memory device according to embodiments of the present technology may be improved.

Figure 1A:
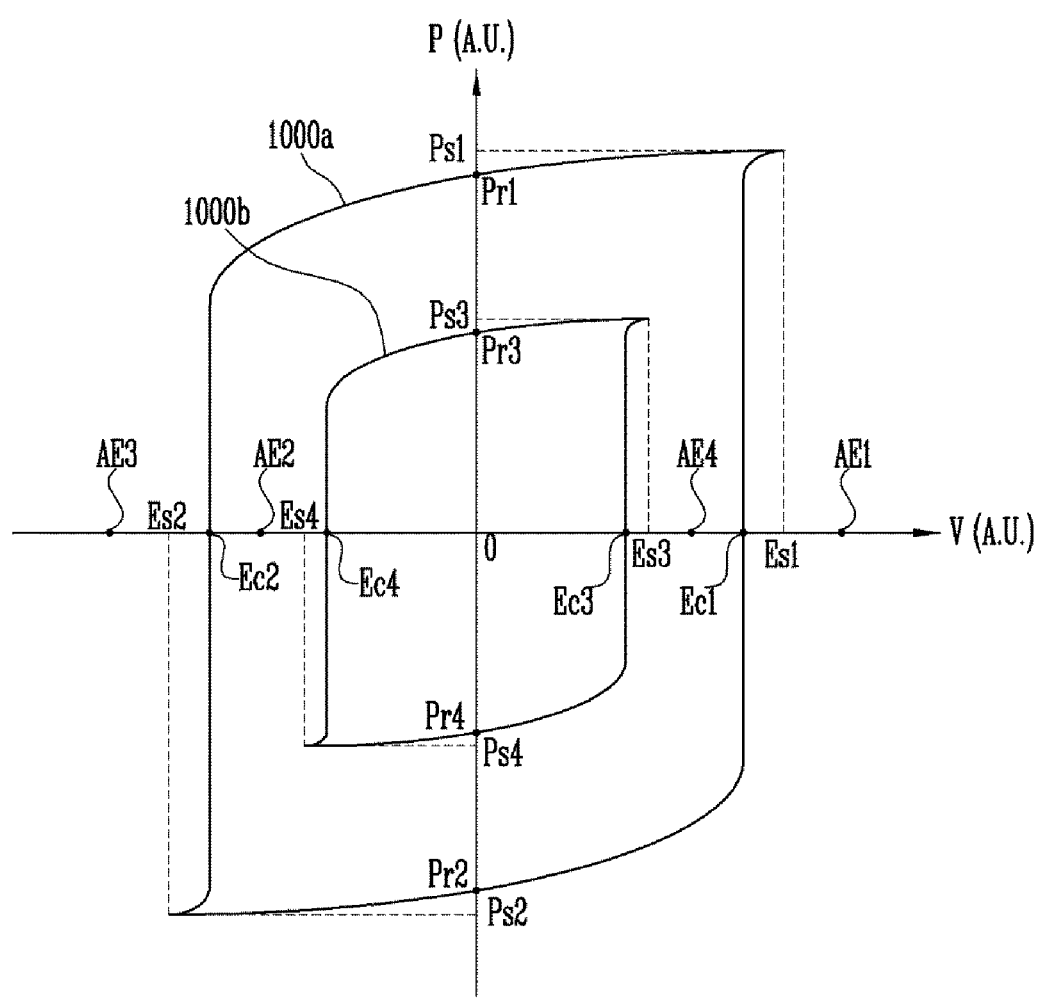
FIG. 1A is a hysteresis graph schematically illustrating an electric field versus polarization characteristic of a ferroelectric layer according to a first embodiment of the present disclosure.

FIG. 1A is a hysteresis graph schematically illustrating an electric field versus polarization characteristic of a ferroelectric layer according to a first embodiment of the present disclosure. FIGS. 1B to 1E are diagrams of a ferroelectric element structure for describing the electric field versus polarization characteristic of the ferroelectric layer according to FIG. 1A.

Figure 1B:
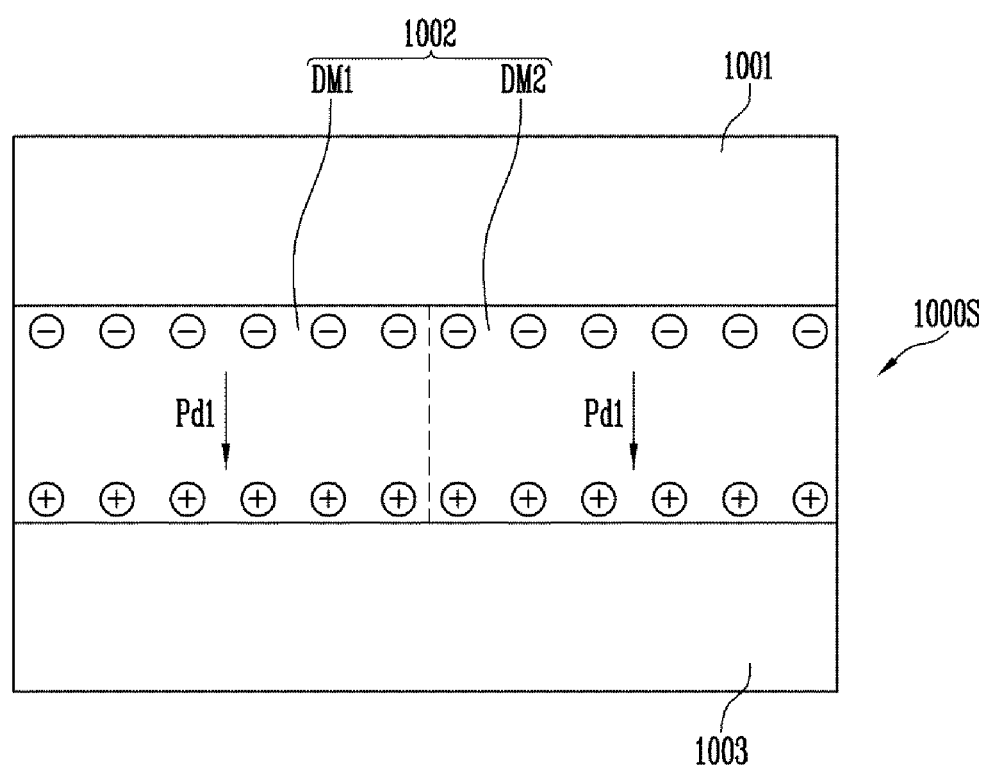
FIGS. 1B, 1C, 1D, and 1E are diagrams of a ferroelectric element structure for describing the electric field versus polarization characteristic of the ferroelectric layer according to FIG. 1A.

Referring to FIGS. 1A and 1B, the ferroelectric element structure 1000S may include a first electrode 1001, a ferroelectric layer 1002, and a second electrode 1003. The ferroelectric layer 1002 may include a ferroelectric material, and may have a crystal structure having ferroelectricity. The ferroelectric layer 1002 may include a first domain DM1 and a second domain DM2. The first and second domains DM1 and DM2 may have different crystal structures. The first and second domains DM1 and DM2 may have different electric field versus polarization characteristics.

When an electric field is applied between the first and second electrodes 1001 and 1003 of the ferroelectric element structure 1000S, polarizations of each of the first and second domains DM1 and DM2 of the ferroelectric layer 1002 may have a characteristic following the hysteresis graphs 1000$a$ and 1000$b$ of FIG. 1A. The polarization of the first domain DM1 may have a characteristic following the first hysteresis graph 1000$a$, and the polarization of the second domain DM2 may have a characteristic following the second hysteresis graph 1000$b$.

The first hysteresis graph 1000$a$ may represent a pair of first and second constant electric fields Ec1 and Ec2 and a pair of first and second residual polarizations Pr1 and Pr2. At this time, the first residual polarization Pr1 may have a first polarization orientation Pd1, and the second residual polarization Pr2 may have a second polarization orientation Pd2 opposite to the first polarization orientation Pd1 (refer to FIG. 1D). In addition, the first hysteresis graph 1000$a$ may represent a pair of first and second saturation polarizations Ps1 and Ps2 in a pair of first and second saturation electric fields Es1 and Es2, respectively.

The second hysteresis graph 1000$b$ may represent a pair of third and fourth constant electric fields Ec3 and Ec4 and a pair of third and fourth residual polarizations Pr3 and Pr4. At this time, the third residual polarization Pr3 may have the first polarization orientation Pd1, and the fourth residual polarization Pr4 may have the second polarization orientation Pd2 opposite to the first polarization orientation Pd1 (refer to FIG. 1D). In addition, the second hysteresis graph 1000$b$ may represent a pair of third and fourth saturation polarizations Ps3 and Ps4 in a pair of third and fourth saturation electric fields Es3 and Es4, respectively.

Referring to FIGS. 1A and 1B, a first electric field AE1 may be generated in a direction from the first electrode 1001 to the second electrode 1003 by grounding the second electrode 1003 and applying a voltage of a positive polarity to the first electrode 1001. An absolute value of the first electric field AE1 may be equal to or greater than an absolute value of the first saturation electric field Es1 of the first domain DM1. In this case, the first domain DM1 may have the first saturation polarization Ps1, and the second domain DM2 may have the third saturation polarization Ps3. Subsequently, when the first electric field AE1 is removed, the first domain DM1 may have the first residual polarization Pr1 having the first polarization orientation Pd1 as shown in FIG. 1B, and the second domain DM2 may have the third residual polarization Pr3 having the first polarization orientation Pd1 as shown in FIG. 1B.

Figure 1C:
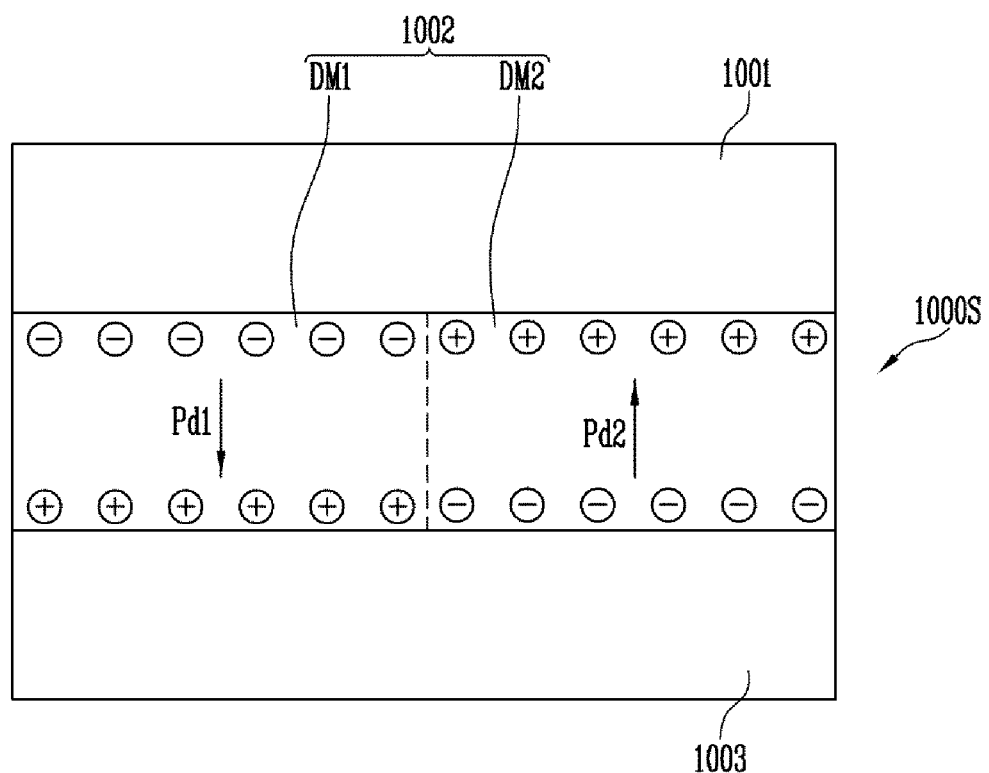

Referring to FIGS. 1A and 1C, a second electric field AE2 may be generated in a direction from the second electrode 1003 to the first electrode 1001 by grounding the second electrode 1003 and applying a voltage of a negative polarity to the first electrode 1001, in a state where the first domain DM1 has the first residual polarization Pr1 having the first polarization orientation Pd1 and the second domain DM2 has the third residual polarization Pr3 having the first polarization orientation Pd1. An absolute value of the second electric field AE2 may be equal to or greater than an absolute value of the fourth saturation electric field Es4 of the second domain DM2 and may be less than an absolute value of the second constant electric field Ec2 of the first domain DM1. In this case, a polarization direction of the first domain DM1 might not change, and the second domain DM2 may have the fourth saturation polarization Ps4. Subsequently, when the second electric field AE2 is removed, the first domain DM1 may have the residual polarization having the first polarization orientation Pd1 as shown in FIG. 1C, and the second domain DM2 may have the fourth residual polarization Pr4 having the second polarization orientation Pd2 as shown in FIG. 1C.

Figure 1D:
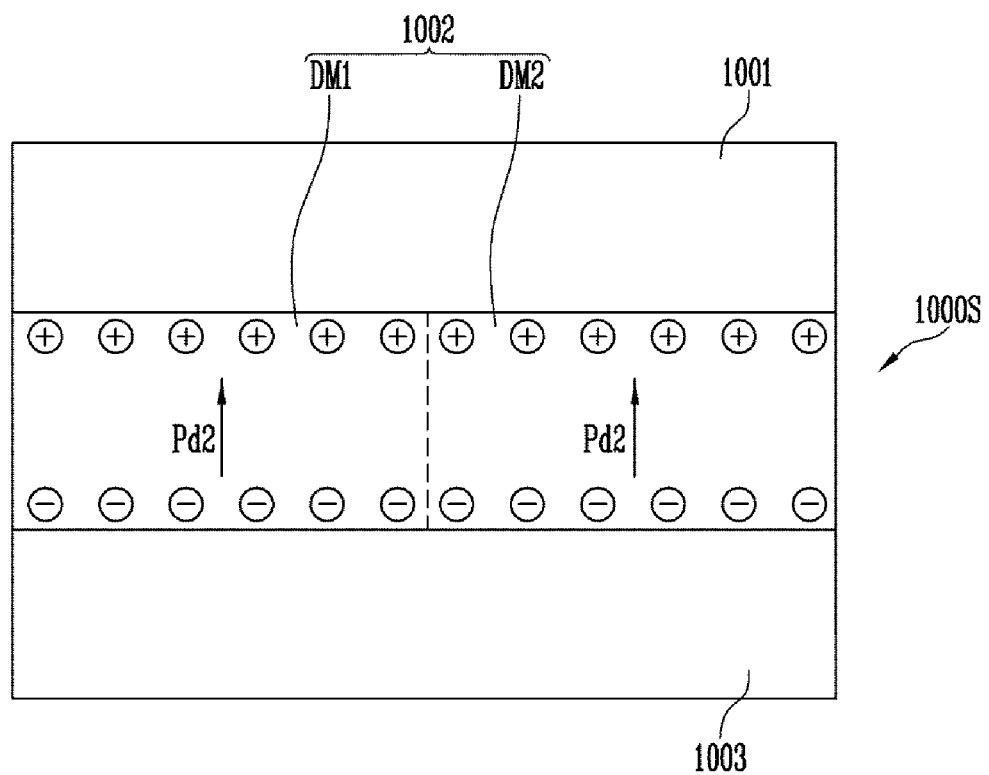

Referring to FIGS. 1A and 1D, a third electric field AE3 may be generated in the direction from the second electrode 1003 to the first electrode 1001 by grounding the second electrode 1003 and applying a voltage of a negative polarity to the first electrode 1001, in a state where the first domain DM1 has the residual polarization having the first polarization orientation Pd1 and the second domain DM2 has the fourth residual polarization Pr4 having the second polarization orientation Pd2. An absolute value of the third electric field AE3 may be equal to or greater than an absolute value of the second saturation electric field Es2 of the first domain DM1. In this case, the first domain DM1 may have the second saturation polarization Ps2, and the second domain DM2 may have the fourth saturation polarization Ps4. Subsequently, when the third electric field AE3 is removed, the first domain DM1 may have the second residual polarization Pr2 having the second polarization orientation Pd2 as shown in FIG. 1D, and the second domain DM2 may have the fourth residual polarization Pr4 having the second polarization orientation Pd2 as shown in FIG. 1D.

Figure 1E:
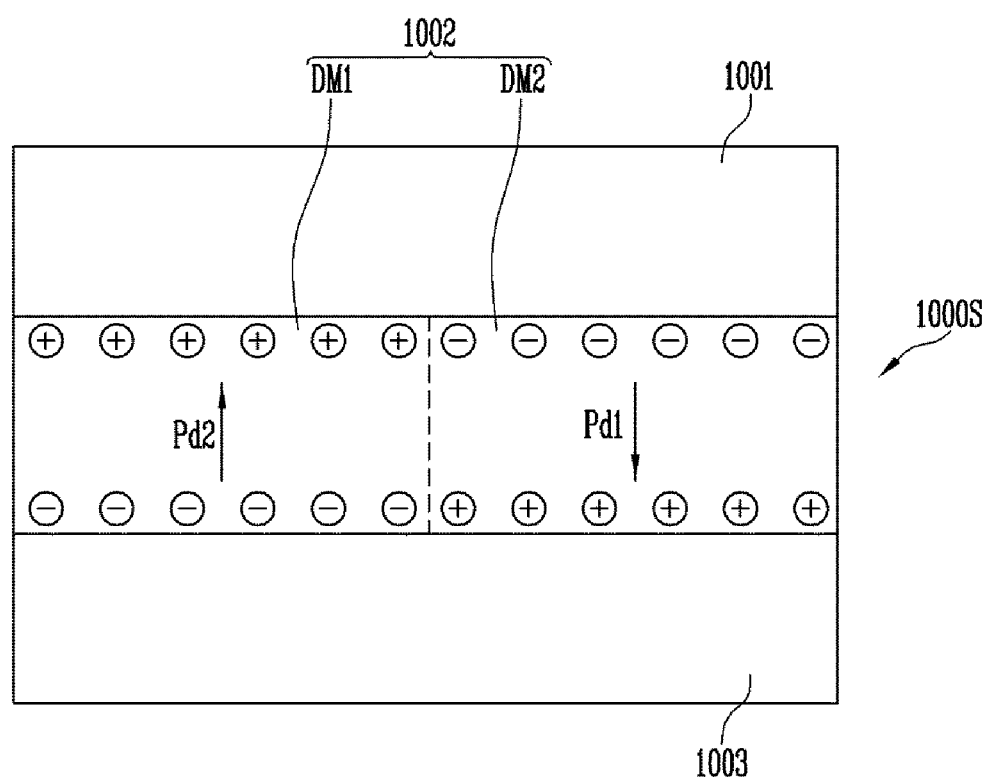

Referring to FIGS. 1A and 1E, a fourth electric field AE4 may be generated in the direction from the first electrode 1001 to the second electrode 1003 by grounding the second electrode 1003 and applying a voltage of a positive polarity to the first electrode 1001, in a state where the first domain DM1 has the second residual polarization Pr2 having the second polarization orientation Pd2 and the second domain DM2 has the fourth residual polarization Pr4 having the second polarization orientation Pd2. An absolute value of the fourth electric field AE4 may be equal to or greater than an absolute value of the third saturation electric field Es3 of the second domain DM2 and may be less than an absolute value of the first constant electric field Ec1 of the first domain DM1. In this case, the polarization direction of the first domain DM1 might not change, and the second domain DM2 may have the third saturation polarization Ps3. Subsequently, when the fourth electric field AE4 is removed, the first domain DM1 may have the residual polarization having the second polarization orientation Pd2 as shown in FIG. 1D, and the second domain DM2 may have the third residual polarization Pr3 having the first polarization orientation Pd1 as shown in FIG. 1D. As described above, the directions of the residual polarizations of the first and second domains DM1 and DM2 of the ferroelectric layer 1002 may be adjusted according to the direction and size of the electric fields AE1, AE2, AE3, and AE4 applied to the first and second domains DM1 and DM2.

Figure 2A:
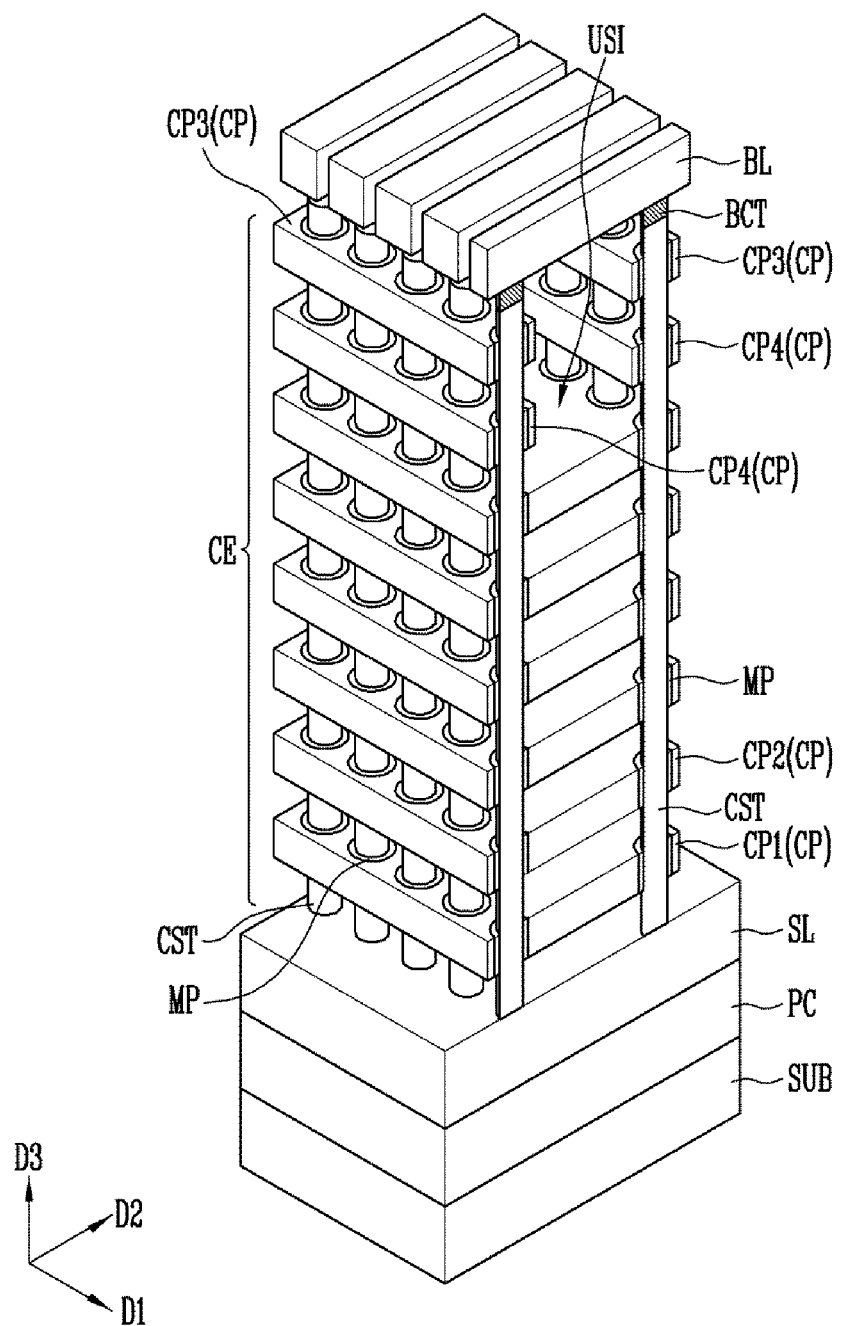
FIG. 2A is a perspective view schematically illustrating a semiconductor memory device according to a second embodiment of the present disclosure.
Figure 2B:
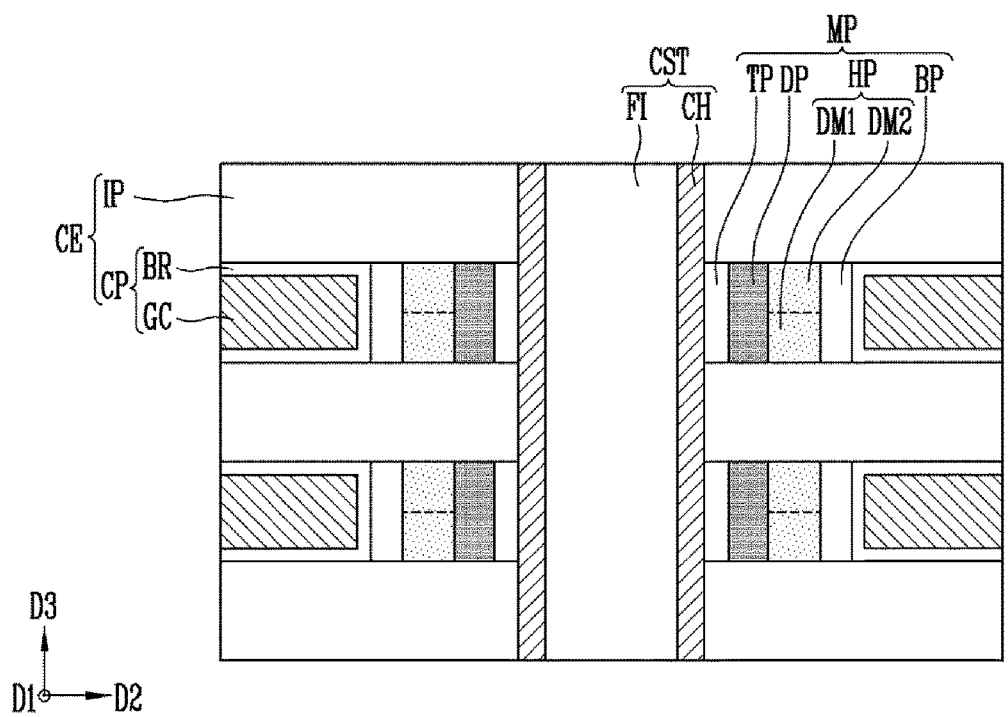
FIG. 2B is a cross-sectional view for describing the semiconductor memory device according to FIG. 2A in detail.
Figure 2C:
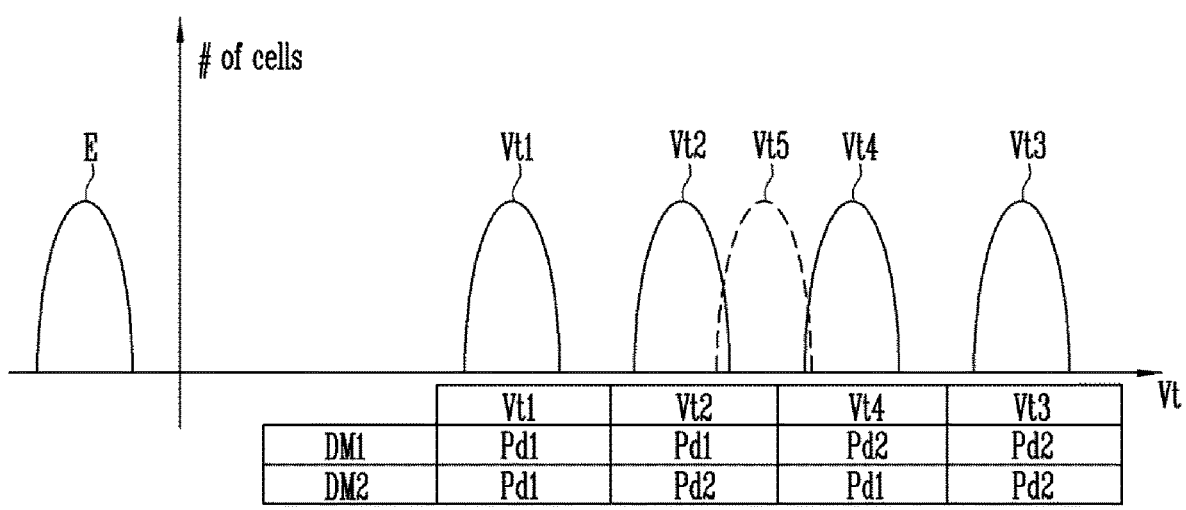
FIG. 2C is a threshold voltage distribution diagram for describing a method of operating the semiconductor memory device according to FIGS. 2A and 2B.

FIG. 2A is a perspective view schematically illustrating a semiconductor memory device according to a second embodiment of the present disclosure. FIG. 2B is a cross-sectional view for describing the semiconductor memory device according to FIG. 2A. FIG. 2C is a threshold voltage distribution diagram for describing a method of operating the semiconductor memory device according to FIGS. 2A and 2B.

Referring to FIG. 2A, the semiconductor memory device may include a substrate SUB, a peripheral circuit structure PC on the substrate SUB, and a memory cell array on the peripheral circuit structure PC.

The substrate SUB may be a single crystal semiconductor film. For example, the substrate SUB may be a bulk silicon substrate, a silicon-on-insulator substrate, a germanium substrate, a germanium-on-insulator substrate, a silicon-germanium substrate, or an epitaxial thin film formed through a selective epitaxial growth method.

The peripheral circuit structure PC may include NMOS transistors, PMOS transistors, a resistor, and a capacitor electrically connected to a memory cell array. The NMOS transistors, the PMOS transistors, the resistor, and the capacitor may be used as elements configuring a row decoder, a column decoder, a page buffer circuit, and an input/output circuit.

The peripheral circuit structure PC may be disposed between the memory cell array and the substrate SUB. For example, the memory cell array may overlap the peripheral circuit structure PC vertically (that is, in a third direction D3). The third direction D3 may be a direction perpendicular to an upper surface of the substrate SUB. When the memory cell array is disposed on the peripheral circuit structure PC, the area of the substrate SUB occupied by the memory cell array and the peripheral circuit structure PC may be reduced. Differently from the shown embodiment, the peripheral circuit structure PC might not overlap the memory cell array. In other words, the peripheral circuit structure PC and the memory cell array may be spaced apart in a plane (that is, in a first direction D1 or a second direction D2). The first direction D1 may be a direction parallel to the upper surface of the substrate SUB. The second direction D2 may be a direction parallel to the upper surface of the substrate SUB and perpendicular to the first direction D1.

The memory cell array may include a source film SL, bit lines BL, bit line contacts BCT, a stack CE, channel structures CST, and memory patterns MP.

The source film SL may be used as a source line and may be provided on the peripheral circuit structure PC. The source film SL may be formed of a doped semiconductor film including a source dopant. For example, the source dopant may be an n-type dopant. For example, the source film SL may be formed by depositing the doped semiconductor film on the peripheral circuit structure PC. For example, the doped semiconductor film may include doped silicon.

The stack CE may be provided on the source film SL. The stack CE may include conductive patterns CP and insulating patterns (not shown). The conductive patterns CP and the insulating patterns may be alternately arranged along the third direction D3. In other words, the conductive patterns CP and the insulating patterns may be alternately stacked along the third direction D3. For example, the insulating patterns may include silicon oxide.

The conductive pattern CP disposed closest to the source film SL may be defined as a first conductive pattern CP1. The conductive pattern CP adjacent to the first conductive pattern CP1 may be defined as a second conductive pattern CP2.

The conductive patterns CP disposed furthest from the source film SL may be defined as third conductive patterns CP3. The third conductive patterns CP3 may be spaced apart from each other in the second direction D2 by an upper slit USI. The conductive patterns CP adjacent to the third conductive patterns CP3 may be defined as fourth conductive patterns CP4. The fourth conductive patterns CP4 may be spaced apart from each other in the second direction D2 by the upper slit USI. The upper slit USI may vertically overlap the conductive patterns CP except for the third and fourth conductive patterns CP3 and CP4.

For example, the first and second conductive patterns CP1 and CP2 may be used as source select lines, and the third and fourth conductive patterns CP3 and CP4 may be used as drain select lines. However, the present disclosure is not limited thereto. Conductive patterns disposed between the source select lines and the drain select lines may be used as word lines.

The channel structures CST may extend in the third direction D3 and penetrate the stack CE. A plurality of channel structures CST penetrating one third conductive pattern CP3 may be arranged in the first direction D1. The plurality of channel structures CST electrically connected to one bit line BL may be arranged in the second direction D2. The channel structures CST may be in contact with the source film SL. The channel structures CST may be electrically connected to the source film SL.

The memory pattern MP may be provided between each of the channel structures CST and each of the conductive patterns CP. The memory pattern MP may have a ring shape. The memory pattern MP may surround a portion of a sidewall of a channel structure CST. The memory pattern MP may be positioned at the same level as the conductive pattern CP. A plurality of memory patterns MP may be disposed in one conductive pattern CP. One conductive pattern CP may surround sidewalls of the plurality of memory patterns MP. The plurality of memory patterns MP may be disposed between two insulating patterns adjacent to each other.

The bit lines BL may be provided on the stack CE. The bit lines BL may extend in the second direction D2. The bit lines BL may be arranged to be spaced apart from each other in the first direction D1. The bit lines BL may be electrically connected to the channel structures CST. The bit lines BL may include a conductive material. For example, the bit lines BL may include tungsten, aluminum, or copper.

The bit line contacts BCT may be provided between the bit lines BL and the channel structures CST. Each of the bit line contacts BCT may electrically connect the bit line BL and the channel structure CST to each other. The bit line contacts BCT may include a conductive material. For example, the bit line contacts BCT may include tungsten, aluminum, or copper.

Referring to FIG. 2B, the stack CE may include conductive patterns CP and insulating patterns IP. The conductive pattern CP may be disposed between two insulating patterns IP adjacent to each other. Each of the conductive patterns CP may include a gate conductive film GC and a barrier film BR. The barrier film BR may surround the gate conductive film GC. For example, the gate conductive film GC may include at least one of a doped silicon film, a metal silicide film, tungsten, nickel, and cobalt, and may be used as a word line connected to a memory cell or a select line connected to a select transistor. For example, the barrier film BR may include at least one of titanium, nitride, and tantalum nitride. In an embodiment, a memory cell may include a conductive pattern CP, a channel structure CST, and a storage pattern DP and a ferroelectric pattern HP between the conductive pattern CP and the channel structure CST.

The channel structure CST may extend in the third direction D3 to penetrate the insulating patterns IP, the conductive patterns CP, and the memory patterns MP. The channel structure CST may include a channel film CH and a filling film FI. As shown in the drawing, in the present embodiment, the channel film CH may have a shape of a cylinder. The filling film FI may be provided in the channel film CH. For example, the channel film CH may include doped polysilicon or undoped polysilicon. For example, the filling film FI may include silicon oxide.

Apart from the shown embodiment, in an embodiment different from the present embodiment, the channel film CH may a shape of a pillar. In this case, the filling film FI might not be formed in the channel film CH.

The memory pattern MP may be disposed between two insulating patterns IP adjacent to each other. The memory pattern MP may be disposed between the channel structure CST and the conductive pattern CP. The memory patterns MP adjacent to each other in the third direction D3 may be spaced apart from each other with the insulating pattern IP therebetween.

Each of the memory patterns MP may include a tunnel pattern TP that is in contact with an outer sidewall of the channel film CH of the channel structure CST, a blocking pattern BP that is in contact with a sidewall of the barrier film BR of the conductive pattern CP, and a storage pattern DP and a ferroelectric pattern HP between the tunnel pattern TP and the blocking pattern BP. The storage pattern DP may surround the tunnel pattern TP, the ferroelectric pattern HP may surround the storage pattern DP, and the blocking pattern BP may surround the ferroelectric pattern HP.

An upper surface of the tunnel pattern TP, an upper surface of the blocking pattern BP, an upper surface of the storage pattern DP, and an upper surface of the ferroelectric pattern HP may be in contact with a lower surface of the insulating pattern IP. A lower surface of the tunnel pattern TP, a lower surface of the blocking pattern BP, a lower surface of the storage pattern DP, and a lower surface of the ferroelectric pattern HP may be in contact with an upper surface of the insulating pattern IP.

The tunnel pattern TP may include an oxide capable of charge tunneling. The tunnel pattern TP may have a first thickness capable of the charge tunneling. For example, the tunnel pattern TP may include silicon oxide. The blocking pattern BP may include an oxide capable of blocking transfer of charge. The blocking pattern BP may have a second thickness capable of blocking the transfer of charge. The second thickness may be thicker than the first thickness. For example, the blocking pattern BP may include silicon oxide. The storage pattern DP may include a material to which a charge may be trapped. For example, the storage pattern DP may include at least one of nitride, silicon, a phase change material, and a nanodot.

The ferroelectric pattern HP may include a ferroelectric material. For example, the ferroelectric pattern HP may include at least one of hafnium oxide, zirconium oxide, hafnium zirconium oxide, and hafnium silicon oxide. The ferroelectric pattern HP may include a crystal structure having ferroelectricity. For example, the ferroelectric pattern HP may include a crystal structure of an orthorhombic system. The ferroelectric pattern HP may be formed by crystallizing an amorphous ferroelectric material. For example, the crystallization may be performed by heat treatment. For example, the heat treatment may be performed after the channel film CH is formed or after the conductive pattern CP is formed.

The ferroelectric pattern HP may include a first domain DM1 and a second domain DM2. The first and second domains DM1 and DM2 may include different crystal structures. The first and second domains DM1 and DM2 of the ferroelectric pattern HP of the semiconductor memory device according to the present embodiment may have an electric field versus polarization characteristic similar to that of the first and second domains DM1 and DM2 of the ferroelectric layer 1002 of the ferroelectric element structure 1000S according to FIGS. 1B to 1E. In other words, the electric field versus polarization characteristic of the first domain DM1 of the ferroelectric pattern HP may follow the first hysteresis graph 1000a of FIG. 1A and the electric field versus polarization characteristic of the second domain DM2 of the ferroelectric pattern HP may follow the second hysteresis graph 1000b of FIG. 1A.

In the semiconductor memory device according to the present embodiment, the storage patterns DP may be spaced apart from each other by the insulating patterns IP, and the ferroelectric patterns HP may be spaced apart from each other by the insulating patterns IP. Therefore, interference between the storage patterns DP may be reduced, and interference between the ferroelectric patterns HP may be reduced.

Referring to FIGS. 1A, 2B, and 2C, a method of operating a semiconductor memory device according to the present embodiment will be described. In an initial state, a threshold voltage distribution of a memory cell may be an erase state E.

In the erase state E, a program voltage having a positive polarity may be applied to each of the conductive patterns CP. The first electric field AE1 may be generated in the first and second domains DM1 and DM2 of the ferroelectric pattern HP by the program voltage. The absolute value of the first electric field AE1 may be equal to or greater than the absolute value of the first saturation electric field Es1 of the first domain DM1. A charge may be trapped in the storage pattern DP by the program voltage, and each of the first and second domains DM1 and DM2 may have the residual polarizations having the first polarization orientation Pd1. The memory cell may have a first threshold voltage distribution Vt1 by the charge trapped in the storage pattern DP and the residual polarizations of the first and second domains DM1 and DM2.

A first polarization change voltage having a negative polarity may be applied to each of the conductive patterns CP. The second electric field AE2 may be generated in the first and second domains DM1 and DM2 of the ferroelectric pattern HP by the first polarization change voltage. The absolute value of the second electric field AE2 may be equal to or greater than the absolute value of the fourth saturation electric field Es4 of the second domain DM2 and may be less than the absolute value of the second constant electric field Ec2 of the first domain DM1. An absolute value of the first polarization change voltage may be less than an absolute value of the program voltage. A polarization direction of the second domain DM2 may be changed by the first polarization change voltage. The second domain DM2 may have the residual polarization having the second polarization orientation Pd2 opposite to the first polarization orientation Pd1. The memory cell may have a second threshold voltage distribution Vt2 by the charge trapped in the storage pattern DP and the residual polarizations of the first and second domains DM1 and DM2.

A second polarization change voltage having a negative polarity may be applied to each of the conductive patterns CP. The third electric field AE3 may be generated in the first and second domains DM1 and DM2 of the ferroelectric pattern HP by the second polarization change voltage. The absolute value of the third electric field AE3 may be equal to or greater than the absolute value of the second saturation electric field Es2 of the first domain DM1. An absolute value of the second polarization change voltage may be greater than the absolute value of the first polarization change voltage. The absolute value of the second polarization change voltage may be less than the absolute value of the program voltage. The polarization direction of the first domain DM1 may be changed by the second polarization change voltage. The first domain DM1 may have the residual polarization having the second polarization orientation Pd2. The memory cell may have a third threshold voltage distribution Vt3 by the charge trapped in the storage pattern DP and the residual polarizations of the first and second domains DM1 and DM2.

A third polarization change voltage having a positive polarity may be applied to each of the conductive patterns CP. The fourth electric field AE4 may be generated in the first and second domains DM1 and DM2 of the ferroelectric pattern HP by the third polarization change voltage. The absolute value of the fourth electric field AE4 may be equal to or greater than the absolute value of the third saturation electric field Es3 of the second domain DM2 and may be less than the absolute value of the first constant electric field Ec1 of the first domain DM1. An absolute value of the third polarization change voltage may be less than the absolute value of the second polarization change voltage. The polarization direction of the second domain DM2 may be changed by the third polarization change voltage. The second domain DM2 may have the residual polarization having the first polarization orientation Pd1. The memory cell may have a fourth threshold voltage distribution Vt4 by the charge trapped in the storage pattern DP and the residual polarizations of the first and second domains DM1 and DM2.

In the above description, the first to third polarization change voltages are sequentially applied after the program voltage is applied, but the present disclosure might not be limited thereto. In other words, the polarization orientation of the residual polarizations of the first and second domains DM1 and DM2 of the ferroelectric pattern HP may be adjusted by freely applying the first to third polarization change voltages. For example, the program voltage, the second polarization change voltage, and the third polarization change voltage may be sequentially applied to adjust the memory cell to have the fourth threshold voltage distribution Vt4.

As described above, the semiconductor memory device according to the present embodiment may use the polarization characteristic of the ferroelectric pattern HP and the charge trap characteristic of the storage pattern DP together, and thus the memory cell may operate as a multilevel memory cell. For example, when the memory cell uses only the charge trap characteristic of the storage pattern DP, the memory cell may have a fifth threshold voltage distribution Vt5, however, the memory cell may have the first to fourth threshold voltage distributions Vt1, Vt2, Vt3, and Vt4 by using the polarization characteristic of the ferroelectric pattern HP together.

In the above description, the memory cell may have first to fourth threshold voltage distributions Vt1, Vt2, Vt3, and Vt4. However, when a technique in which the memory cell has a plurality of threshold voltage distributions by adjusting an amount of charge trapped in the storage pattern DP is applied to the present disclosure, the memory cell may have eight or more threshold voltage distributions.

The semiconductor memory device according to the present embodiment may use the polarization characteristic of the ferroelectric pattern HP. Therefore, switching between levels of the threshold voltage distributions of the memory cell may be performed relatively quickly. Thus, a program and erase operation time may be shortened. In addition, a relatively large threshold voltage window may be ensured by using the charge trapping characteristic of the storage pattern DP. Here, the threshold voltage window means a level range in which a threshold voltage corresponding to an erase state and a program state may be distributed. When the threshold voltage window increases, a margin between different threshold voltages increases, and thus reliability of memory cells may be improved.

Figure 3A:
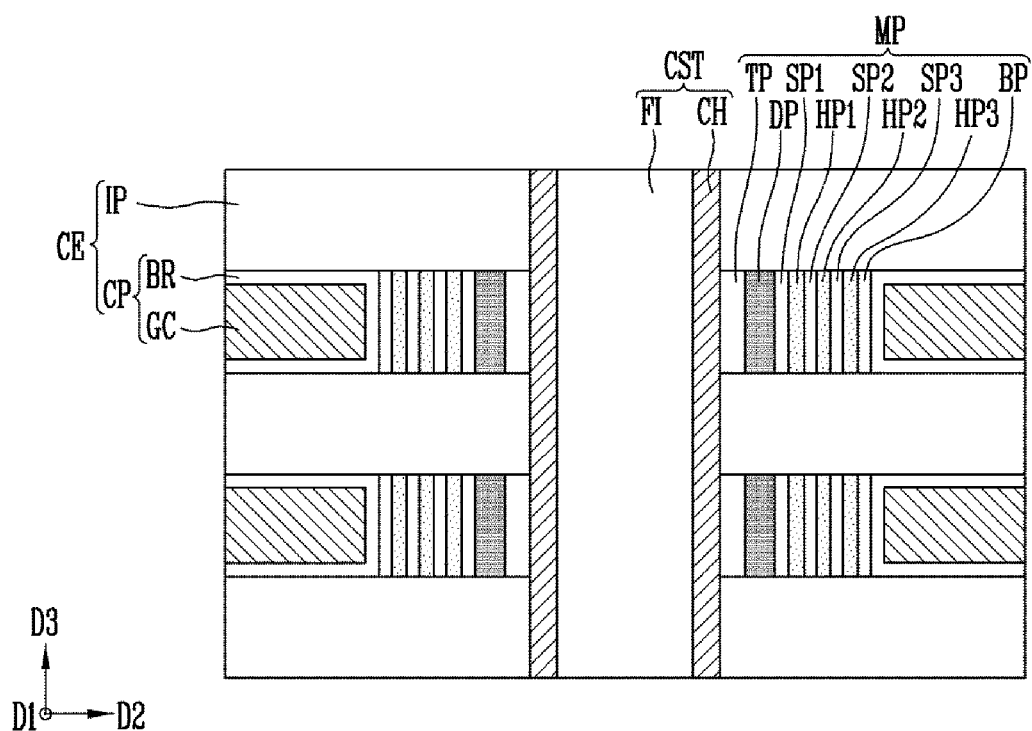
FIG. 3A is a cross-sectional view of a semiconductor memory device according to a third embodiment of the present disclosure.

FIG. 3A is a cross-sectional view of a semiconductor memory device according to a third embodiment of the present disclosure.

The semiconductor memory device according to the present embodiment may be similar to the semiconductor memory device of FIGS. 2A and 2B except for the following description.

Referring to FIG. 3A, the memory pattern MP of the semiconductor memory device according to the present embodiment may include the tunnel pattern TP that is in contact with the outer sidewall of the channel film CH of the channel structure CST, the blocking pattern BP that is in contact with the sidewall of the barrier film BR, the storage pattern DP between the tunnel pattern TP and the blocking pattern BP, and separation patterns SP1, SP2, and SP3 and ferroelectric patterns HP1, HP2, and HP3 between the blocking pattern BP and the storage pattern DP.

The separation patterns SP1, SP2, and SP3 may include a first separation pattern SP1, a second separation pattern SP2, and a third separation pattern SP3. The ferroelectric patterns HP1, HP2, and HP3 may include a first ferroelectric pattern HP1, a second ferroelectric pattern HP2, and a third ferroelectric pattern HP3. The first to third separation patterns SP1, SP2, and SP3 and the first to third ferroelectric patterns HP1, HP2, and HP3 may be alternately disposed. For example, the first to third separation patterns SP1, SP2, and SP3 may include silicon oxide.

The first separation pattern SP1 may surround the storage pattern DP. The first ferroelectric pattern HP1 may surround the first separation pattern SP1. The second separation pattern SP2 may surround the first ferroelectric pattern HP1. The second ferroelectric pattern HP2 may surround the second separation pattern SP2. The third separation pattern SP3 may surround the second ferroelectric pattern HP2. The third ferroelectric pattern HP3 may surround the third separation pattern SP3. The blocking pattern BP may surround the third ferroelectric pattern HP3.

The storage pattern DP and the first ferroelectric pattern HP1 may be spaced apart from each other with the first separation pattern SP1 interposed therebetween. The first and second ferroelectric patterns HP1 and HP2 may be spaced apart from each other with the second separation pattern SP2 interposed therebetween. The second and third ferroelectric patterns HP2 and HP3 may be spaced apart from each other with the third separation pattern SP3 interposed therebetween. The first to third ferroelectric patterns HP1, HP2, and HP3 may include different ferroelectric materials. In an embodiment different from the present embodiment, some of the first to third ferroelectric patterns HP1, HP2, and HP3 may include an anti-ferroelectric material.

Figure 3B:
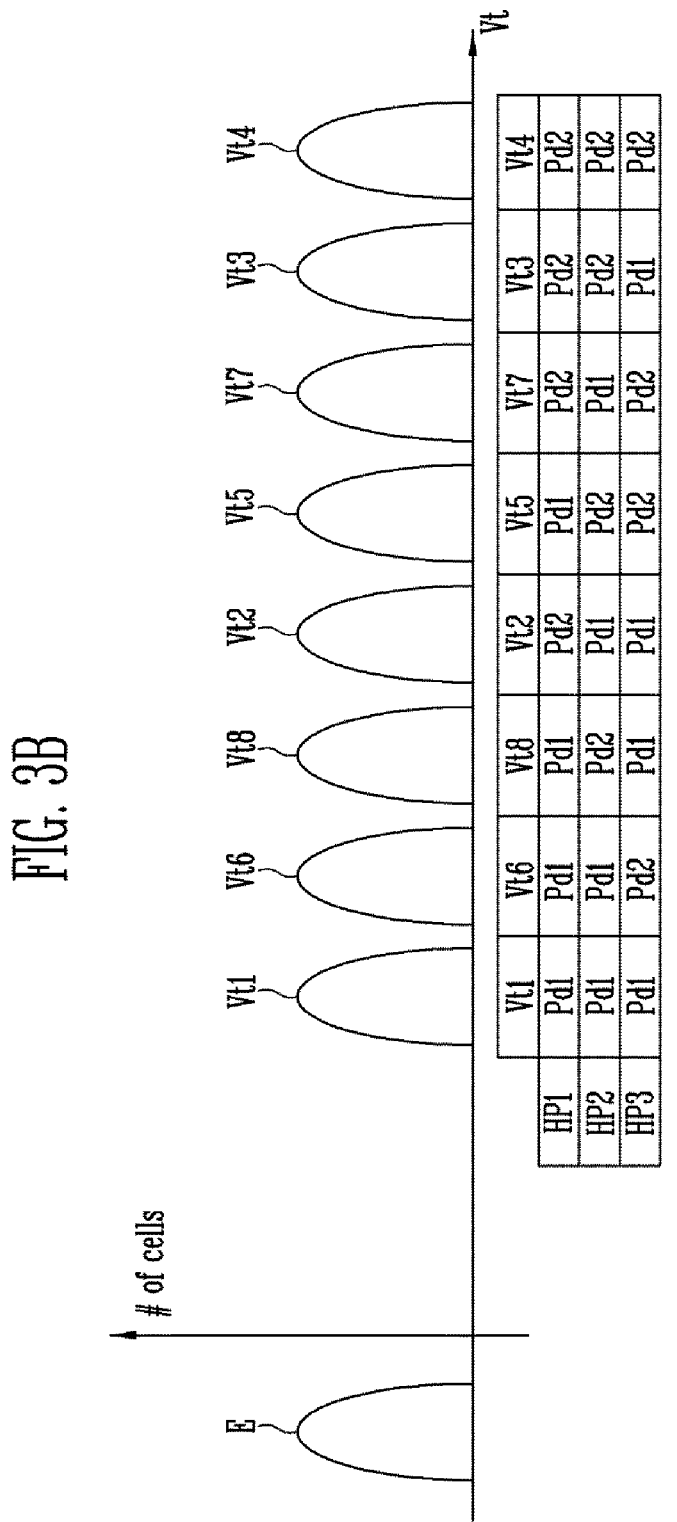
FIG. 3B is a threshold voltage distribution diagram for describing a method of operating the semiconductor memory device according to FIG. 3A.

FIG. 3B is a threshold voltage distribution diagram for describing a method of operating the semiconductor memory device according to FIG. 3A, and illustrates a threshold voltage distribution of a triple level cell (TLC) method in which three bits of data may be stored in one memory cell. Since the threshold voltage distribution of the triple level cell (TLC) method is an embodiment for understanding of the present technology, the present technology is not limited to the triple level cell (TLC).

The method of operating the semiconductor memory device according to the present embodiment will be described with reference to FIGS. 3A and 3B. The following operation method will be described by taking an example in which the first to third ferroelectric patterns HP1, HP2, and HP3 include the same material.

In an initial state, the threshold voltage distribution of the memory cell may be an erase state E.

In the erase state E, a program voltage having a positive polarity may be applied to each of the conductive patterns CP. A first electric field may be applied to the first ferroelectric pattern HP1, a second electric field may be applied to the second ferroelectric pattern HP2, and a third electric field may be applied to the third ferroelectric pattern HP3, by the program voltage. An absolute value of the first electric field may be greater than an absolute value of the second electric field, and the absolute value of the second electric field may be greater than an absolute value of the third electric field. The absolute values of each of the first to third electric fields may be greater than absolute values of saturation electric fields of the first to third ferroelectric patterns HP1, HP2, and HP3. A charge may be trapped in the storage pattern DP by the program voltage, and each of the first to third ferroelectric patterns HP1, HP2, and HP3 may have the residual polarizations having the first polarization orientation Pd1. The memory cell may have the first threshold voltage distribution Vt1 by the charge trapped in the storage pattern DP and the residual polarizations of the first to third ferroelectric patterns HP1, HP2, and HP3.

In a state where the memory cell has the first threshold voltage distribution Vt1, a first polarization change voltage having a negative polarity may be applied to each of the conductive patterns CP. A fourth electric field may be applied to the first ferroelectric pattern HP1, a fifth electric field may be applied to the second ferroelectric pattern HP2, and a sixth electric field may be applied to the third ferroelectric pattern HP3, by the first polarization change voltage. An absolute value of the fourth electric field may be greater than an absolute value of the fifth electric field, and the absolute value of the fifth electric field may be greater than an absolute value of the sixth electric field. The absolute value of the fourth electric field may be greater than the absolute values of the saturation electric fields of the first to third ferroelectric patterns HP1, HP2, and HP3, and the absolute values of each of the fifth and sixth electric fields may be less than the absolute values of the saturation electric fields of each of the first to third ferroelectric patterns HP1, HP2, and HP3. A polarization direction of the first ferroelectric pattern HP1 may be changed by the first polarization change voltage. The first ferroelectric pattern HP1 may have the residual polarization having the second polarization orientation Pd2 opposite to the first polarization orientation Pd1. The memory cell may have the second threshold voltage distribution Vt2 by the charge trapped in the storage pattern DP and the residual polarizations of the first to third ferroelectric patterns HP1, HP2, and HP3.

In a state where the memory cell has the second threshold voltage distribution Vt2, a second polarization change voltage having a negative polarity may be applied to each of the conductive patterns CP. A seventh electric field may be applied to the first ferroelectric pattern HP1, an eighth electric field may be applied to the second ferroelectric pattern HP2, and a ninth electric field may be applied to the third ferroelectric pattern HP3, by the second polarization change voltage. An absolute value of the seventh electric field may be greater than an absolute value of the eighth electric field, and the absolute value of the eighth electric field may be greater than an absolute value of the ninth electric field. The absolute values of each of the seventh and eighth electric fields may be greater than the absolute values of the saturation electric fields of each of the first to third ferroelectric patterns HP1, HP2, and HP3, and the absolute value of the ninth field may be less than the absolute value of the saturation electric fields of the first to third ferroelectric patterns HP1, HP2, and HP3. A polarization direction of the second ferroelectric pattern HP2 may be changed by the second polarization change voltage. The second ferroelectric pattern HP2 may have the residual polarization having the second polarization orientation Pd2. The memory cell may have the third threshold voltage distribution Vt3 by the charge trapped in the storage pattern DP and the residual polarizations of the first to third ferroelectric patterns HP1, HP2, and HP3.

In a state where the memory cell has the third threshold voltage distribution Vt3, a third polarization change voltage having a negative polarity may be applied to each of the conductive patterns CP. A tenth electric field may be applied to the first ferroelectric pattern HP1, an eleventh electric field may be applied to the second ferroelectric pattern HP2, and a twelfth electric field may be applied to the third ferroelectric pattern HP3, by the third polarization change voltage. An absolute value of the tenth electric field may be greater than an absolute value of the eleventh electric field, and the absolute value of the eleventh electric field may be greater than an absolute value of the twelfth electric field. The absolute values of each of the tenth to twelfth electric fields may be greater than the absolute values of the saturation electric fields of each of the first to third ferroelectric patterns HP1, HP2, and HP3. A polarization direction of the third ferroelectric pattern HP3 may be changed by the third polarization change voltage. The third ferroelectric pattern HP3 may have the residual polarization having the second polarization orientation Pd2. The memory cell may have the fourth threshold voltage distribution Vt4 by the charge trapped in the storage pattern DP and the residual polarizations of the first to third ferroelectric patterns HP1, HP2, and HP3.

In a state where the memory cell has the fourth threshold voltage distribution Vt4, a fourth polarization change voltage having a positive polarity may be applied to each of the conductive patterns CP. A thirteenth electric field may be applied to the first ferroelectric pattern HP1, a fourteenth electric field may be applied to the second ferroelectric pattern HP2, and a fifteenth electric field may be applied to the third ferroelectric pattern HP3, by the fourth polarization change voltage. An absolute value of the thirteenth electric field may be greater than an absolute value of the fourteenth electric field, and the absolute value of the fourteenth electric field may be greater than an absolute value of the fifteenth electric field. The absolute value of the thirteenth electric field may be greater than the absolute values of the saturation electric fields of the first to third ferroelectric patterns HP1, HP2, and HP3. The absolute values of each of the fourteenth and fifteenth electric fields may be less than the absolute value of the saturation electric fields of each of the first to third ferroelectric patterns HP1, HP2, and HP3. The polarization direction of the first ferroelectric pattern HP1 may be changed by the fourth polarization change voltage. The first ferroelectric pattern HP1 may have the residual polarization having the first polarization orientation Pd1. The memory cell may have a fifth threshold voltage distribution Vt5 by the charge trapped in the storage pattern DP and the residual polarizations of the first to third ferroelectric patterns HP1, HP2, and HP3.

In a state where the memory cell has the fifth threshold voltage distribution Vt5, a fifth polarization change voltage having a positive polarity may be applied to each of the conductive patterns CP. A sixteenth electric field may be applied to the first ferroelectric pattern HP1, a seventeenth electric field may be applied to the second ferroelectric pattern HP2, and an eighteenth electric field may be applied the third ferroelectric pattern HP3, by the fifth polarization change voltage. An absolute value of the sixteenth electric field may be greater than an absolute value of the seventeenth electric field, and the absolute value of the seventeenth electric field may be greater than an absolute value of the eighteenth electric field. The absolute values of each of the sixteenth and seventeenth electric fields may be greater than the absolute values of the saturation electric fields of each of the first to third ferroelectric patterns HP1, HP2, and HP3. The absolute value of the eighteenth electric field may be less than the absolute values of the saturation electric fields of the first to third ferroelectric patterns HP1, HP2, and HP3. The polarization direction of the second ferroelectric pattern HP2 may be changed by the fifth polarization change voltage. The second ferroelectric pattern HP2 may have the residual polarization having the first polarization orientation Pd1. The memory cell may have a sixth threshold voltage distribution Vt6 by the charge trapped in the storage pattern DP and the residual polarizations of the first to third ferroelectric patterns HP1, HP2, and HP3.

Similar to the above description, the memory cell may have a seventh threshold voltage distribution Vt7 or an eighth threshold voltage distribution Vt8 by applying an appropriate polarization change voltage to each of the conductive patterns CP.

As described above, distances from which each of the first to third ferroelectric patterns HP1, HP2, and HP3 is spaced apart from the conductive pattern CP may be different from each other, and magnitudes of the electric fields applied to the third ferroelectric patterns HP1, HP2, and HP3 may be different from each other by a voltage applied to the conductive pattern CP. Therefore, the polarization orientation of the residual polarization of each of the first to third ferroelectric patterns HP1, HP2, and HP3 may be adjusted, and the threshold voltage distribution of the memory cell may be adjusted.

The order of applying the first to fifth polarization change voltages after applying the program voltage might not be limited to that described above.

Figure 4:
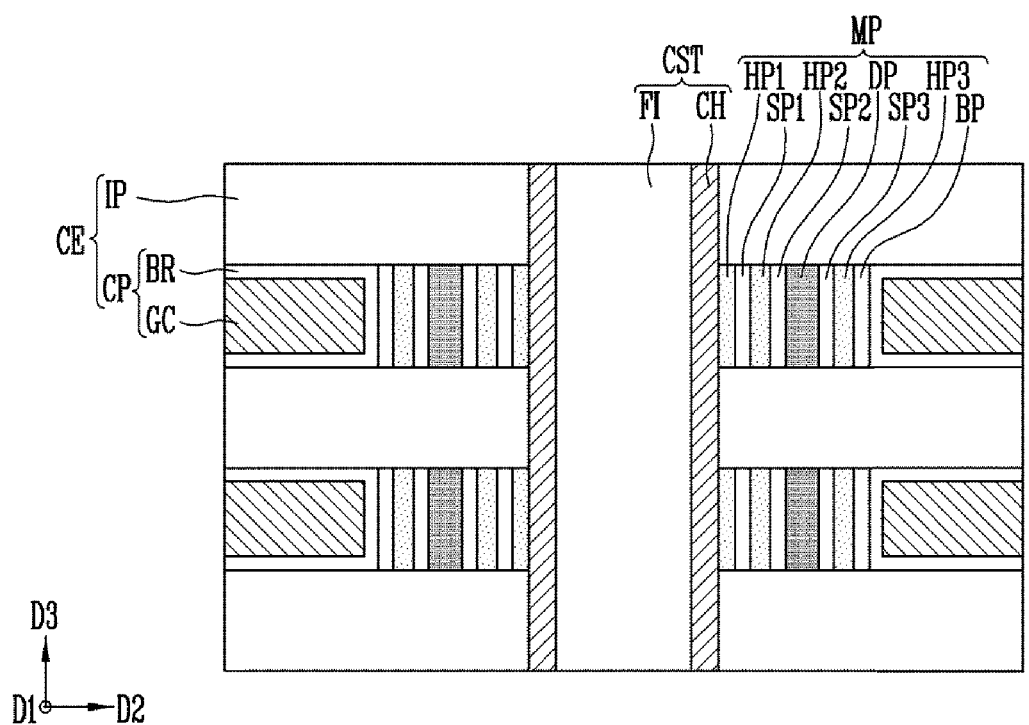
FIG. 4 is a cross-sectional view of a semiconductor memory device according to a fourth embodiment of the present disclosure.

FIG. 4 is a cross-sectional view of a semiconductor memory device according to a fourth embodiment of the present disclosure.

The semiconductor memory device according to the present embodiment may be similar to the semiconductor memory device according to FIGS. 2A and 2B except for the following description.

Referring to FIG. 4, the memory pattern MP of the semiconductor memory device according to the present embodiment may include the blocking pattern BP that is in contact with the sidewall of the barrier film BR of the conductive pattern CP, the first to third ferroelectric patterns HP1, HP2, and HP3, the first to third separation patterns SP1, SP2, and SP3, and the storage pattern DP between the blocking pattern BP and the channel film CH.

The first and second ferroelectric patterns HP1 and HP2 may be provided between the channel structure CST and the storage pattern DP. The first separation pattern SP1 may be provided between the first and second ferroelectric patterns HP1 and HP2, and the second separation pattern SP2 may be provided between the second ferroelectric pattern HP2 and the storage pattern DP. The first ferroelectric pattern HP1 may be in contact with the channel film CH of the channel structure CST.

The third ferroelectric pattern HP3 may be provided between the conductive pattern CP and the storage pattern DP. The third separation pattern SP3 may be provided between the storage pattern DP and the third ferroelectric pattern HP3. The blocking pattern BP may be provided between the third ferroelectric pattern HP3 and the conductive pattern CP. The storage pattern DP may be provided between the second and third ferroelectric patterns HP2 and HP3.

The semiconductor memory device according to the present embodiment may adjust the polarization of each of the first to third ferroelectric patterns HP1, HP2, and HP3 to adjust the threshold voltage distribution of the memory cell.

In the semiconductor memory device according to the present embodiment, the first ferroelectric patterns HP1 may serve as a charge tunnel film, and the third ferroelectric patterns HP3 may serve as a charge blocking film.

The semiconductor memory device according to the present embodiment may operate similarly to the semiconductor memory device according to FIG. 3A. For example, the polarization orientation of the residual polarization of each of the first to third ferroelectric patterns HP1, HP2, and HP3 may be adjusted, and the threshold voltage distribution of the memory cell may be adjusted, by using differences of distances between each of the first to third ferroelectric patterns HP1 HP2, and HP3 from the conductive pattern CP.

Figure 5A:
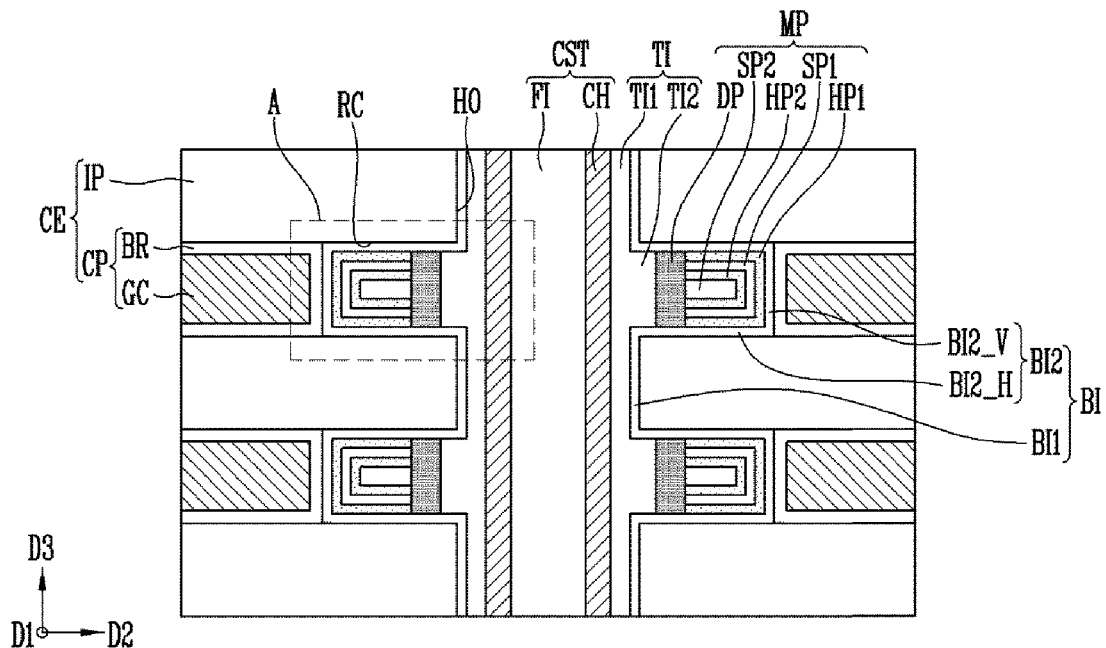
FIG. 5A is a cross-sectional view of a semiconductor memory device according to a fifth embodiment of the present disclosure.
Figure 5B:
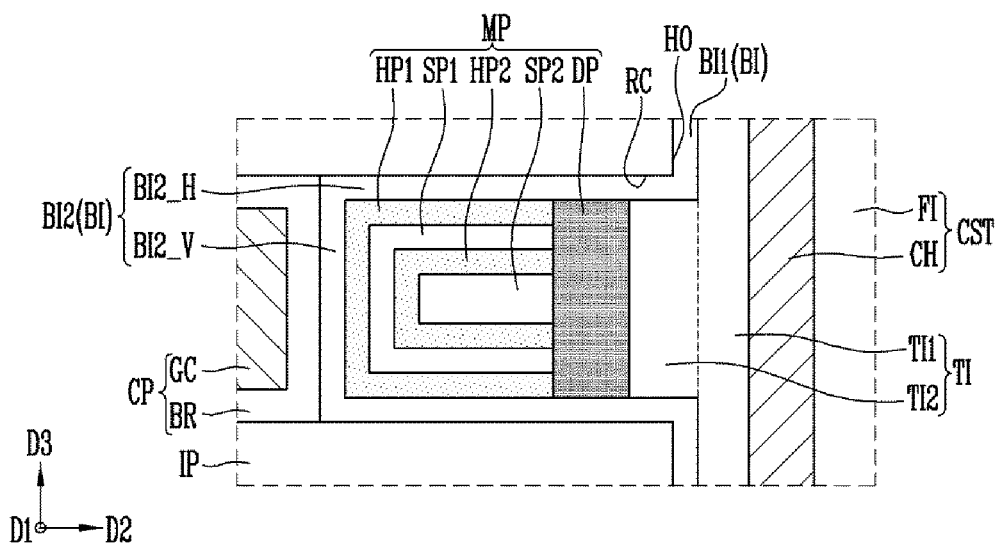
FIG. 5B is an enlarged view of region A of FIG. 5A.

FIG. 5A is a cross-sectional view of a semiconductor memory device according to a fifth embodiment of the present disclosure. FIG. 5B is an enlarged view of region A of FIG. 5A.

The semiconductor memory device according to the present embodiment may be similar to the semiconductor memory device according to FIGS. 2A and 2B except for the following description.

In the semiconductor memory device according to the present embodiment, the stack CE may include a through hole HO and recesses RC. The through hole HO may extend in the third direction D3 to penetrate the stack CE. The through hole HO may penetrate the insulation patterns IP and the conductive patterns CP. The recesses RC may be connected to the through hole HO. The recesses RC may be spaced apart from each other in the third direction D3. The recess RC may be a space defined between the conductive pattern CP and the through hole HO and between the insulating patterns IP.

The semiconductor memory device according to the present embodiment may include a blocking film BI filling the through hole HO and the recesses RC of the stack CE, the memory patterns MP, the tunnel film TI, and the channel structure CST.

The stack CE may include first surfaces defining the through hole HO and second surfaces defining the recesses RC. The first surfaces may be sidewalls of the insulating patterns IP. The second surfaces may be upper and lower surfaces of the insulating patterns IP and sidewalls of the conductive patterns CP. The blocking film BI may cover the first and second surfaces. In other words, the blocking film BI may cover surfaces of the stack CE defining the through hole HO and the recesses RC.

The blocking film BI may include first portions BI1 covering the first surfaces of the stack CE and second portions BI2 covering the second surfaces of the stack CE. The first and second portions BI1 and BI2 may be alternately connected to each other.

Each of the second portions BI2 of the blocking film BI may include horizontal portions BI2_H and vertical portions BI2_V. Each of the horizontal portions BI2_H may cover the upper surface or the lower surface of the insulating pattern IP. The vertical portion BI2_V may cover the sidewall of the conductive pattern CP. The vertical portion BI2_V may connect the horizontal portions BI2_H to each other.

The tunnel film TI may be provided in the blocking film BI, and the channel structure CST may be provided in the tunnel film TI. The tunnel film TI may be in contact with an outer sidewall of the channel structure CST to surround the channel structure CST. The tunnel film TI may include a tunnel cylindrical portion TI1 extending along the outer sidewall of the channel structure CST in the third direction D3, and a tunnel protrusion portions TI2 protruding from the outer sidewall of the tunnel cylindrical portion TI1. The tunnel cylindrical portion TI1 may have a hollow cylinder shape. The tunnel protrusion portions TI2 may be spaced apart from each other in the third direction D3. The tunnel protrusion portion TI2 may protrude between two insulating patterns IP. The tunnel protrusion portion TI2 may protrude into the recess RC. The tunnel protrusion portion TI2 may be positioned at the same level as the conductive pattern CP. The tunnel protrusion portion TI2 may have a ring shape. The tunnel protrusion portion TI2 may be provided between the horizontal portions BI2_H of the second portion BI2 of the blocking film BI.

The memory pattern MP may be provided between the second portion BI2 of the blocking film BI and the tunnel protrusion portion TI2 of the tunnel film TI. The memory pattern MP may be provided in the recess RC. The memory pattern MP may include the storage pattern DP that is in contact with the tunnel protrusion portion TI2 of the tunnel film TI, and the first and second ferroelectric patterns HP1 and HP2 and the first and second separation patterns SP1 and SP2 between the storage pattern DP and the second portion BI2 of the blocking film BI.

Similarly to the second portion BI2 of the blocking film BI, each of the first and second ferroelectric patterns HP1 and HP2 and the first separation pattern SP1 may include horizontal portions and vertical portions.

The first and second separation patterns SP1 and SP2 and the second ferroelectric pattern HP2 may be provided in the first ferroelectric pattern HP1, the second ferroelectric pattern HP2 and the second separation pattern SP2 may be provided in the first separation pattern SP1, and the second separation pattern SP2 may be provided in the second ferroelectric pattern HP2. The first separation pattern SP1 may be provided between the first and second ferroelectric patterns HP1 and HP2.

The first ferroelectric pattern HP1 may be disposed between the horizontal portions BI2_H of the second portion BI2 of the blocking film BI and between the vertical portion BI2_V of the second portion BI2 of the blocking film BI and the storage pattern DP. The first separation pattern SP1 may be disposed between the horizontal portions of the first ferroelectric pattern HP1 and between the vertical portion of the first ferroelectric pattern HP1 and the storage pattern DP. The second ferroelectric pattern HP2 may be disposed between the horizontal portions of the first separation pattern SP1 and between the vertical portion of the first separation pattern SP1 and the storage pattern DP. The second separation pattern SP2 may be disposed between the horizontal portions of the second ferroelectric pattern HP2 and between the vertical portion of the second ferroelectric pattern HP2 and the storage pattern DP.

The storage pattern DP may be in contact with the horizontal portions of the first and second ferroelectric patterns HP1 and HP2 and the first separation pattern SP1. The storage pattern DP may be in contact with the second separation pattern SP2.

FIGS. 6A to 6F are diagrams for describing a method of manufacturing the semiconductor memory device according to FIGS. 5A and 5B. For brevity of description, the same reference numerals are used for the components described with reference to FIGS. 5A and 5B, and repetitive description will be omitted.

Figure 6A:
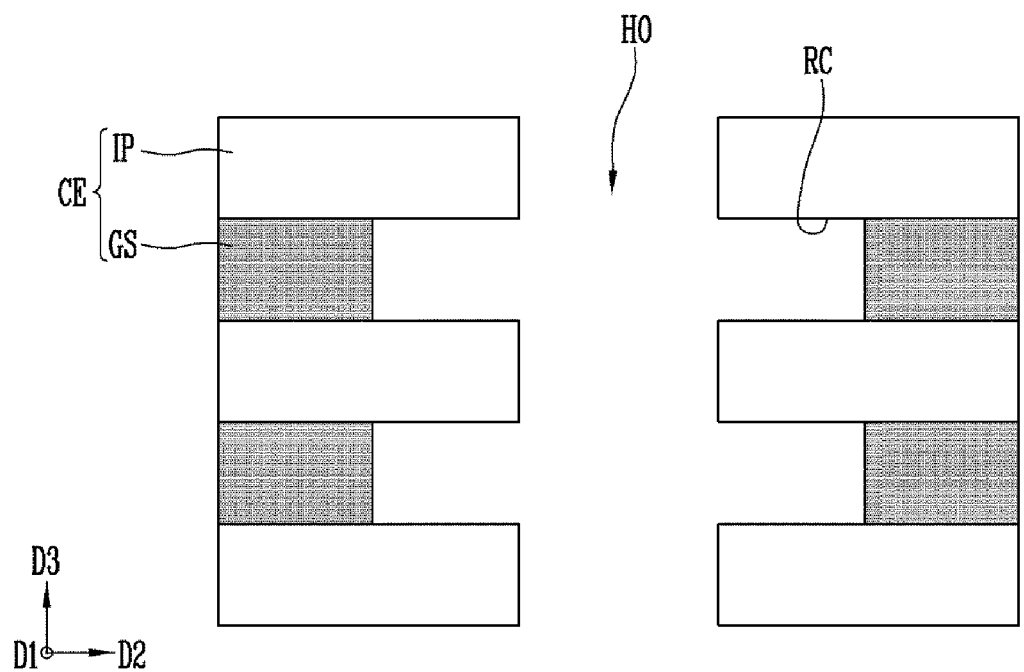
FIGS. 6A, 6B, 6C, 6D, 6E, and 6F are diagrams for describing a method of manufacturing the semiconductor memory device according to FIGS. 5A and 5B.

Referring to FIG. 6A, the stack CE including the insulating patterns IP and gate sacrificial patterns GS may be formed. The gate sacrificial pattern GS may include a material having an etch selectivity with respect to the insulating pattern IP. For example, the gate sacrificial pattern GS may include silicon nitride.

The through hole HO penetrating the stack CE may be formed. Subsequently, the gate sacrificial patterns GS exposed by the through hole HO may be selectively etched to form the recesses RC.

Figure 6B:
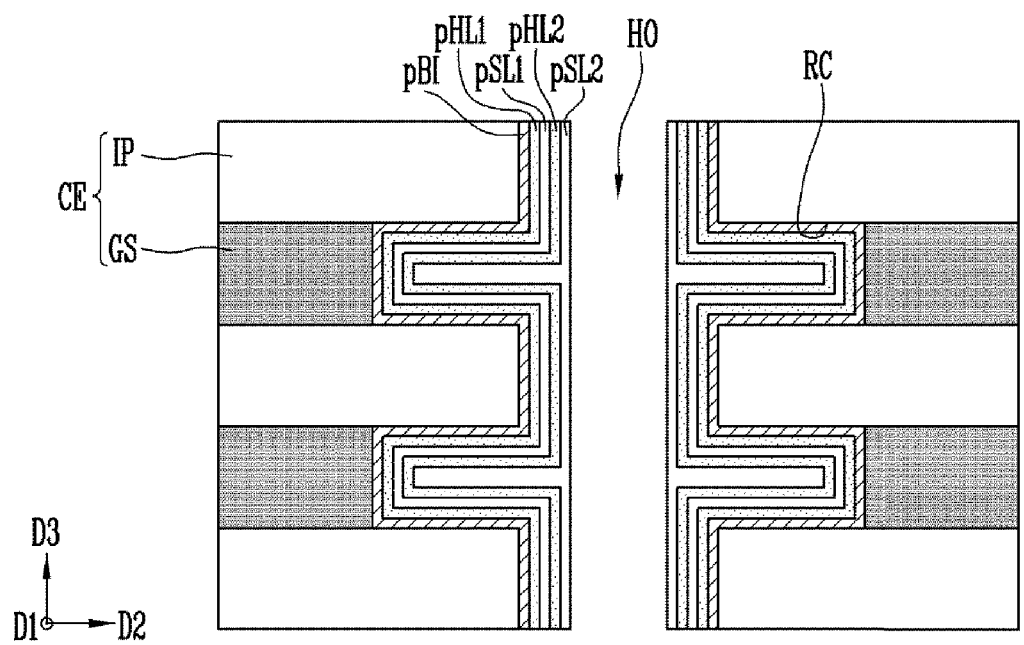

Referring to FIG. 6B, a preliminary blocking film pBI, a first preliminary ferroelectric film pHL1, a first preliminary separation film pSL1, a second preliminary ferroelectric film pHL2, and a second preliminary separation film pSL2 may be sequentially formed on the surfaces of the stack CE defining the through holes HO and the recesses RC. For example, the preliminary blocking film pBI may include polysilicon. For example, the first and second preliminary ferroelectric films pHL1 and pHL2 may include an amorphous ferroelectric material. For example, the first and second preliminary separation films pSL1 and pSL2 may include silicon oxide.

The recesses RC may be completely filled with the preliminary blocking film pBI, the first preliminary ferroelectric film pHL1, the first preliminary separation film pSL1, the second preliminary ferroelectric film pHL2, and the second preliminary separation film pSL2. A portion of the through hole HO may be filled with the preliminary blocking film pBI, the first preliminary ferroelectric film pHL1, the first preliminary separation film pSL1, the second preliminary ferroelectric film pHL2, and the second preliminary separation film pSL2.

Figure 6C:
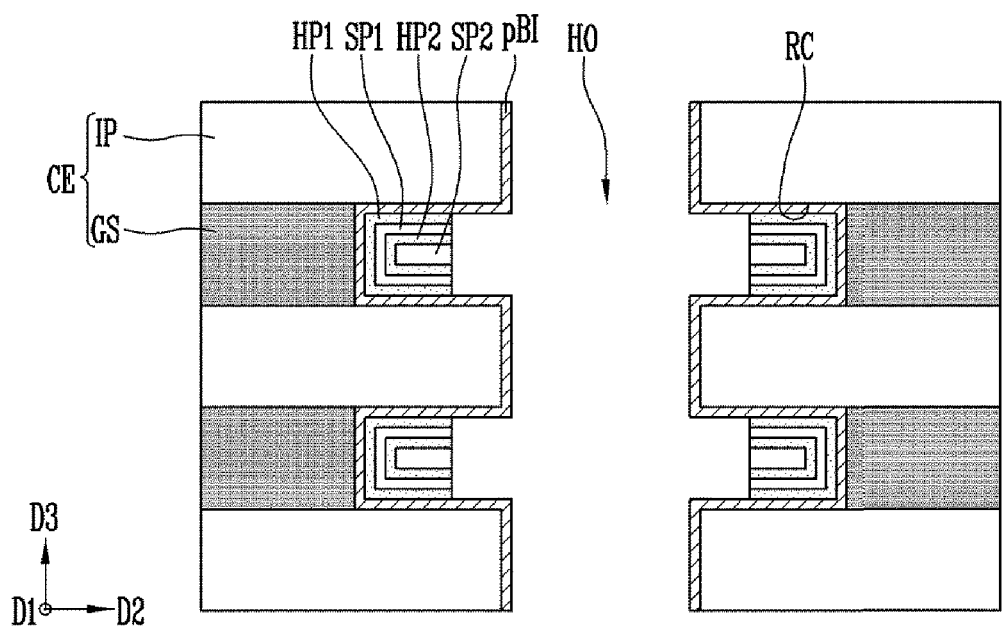

Referring to FIG. 6C, the first and second preliminary ferroelectric films pHL1 and pHL2 and the first and second preliminary separation films pSL1 and pSL2 may be patterned. Portions filling the through hole HO of the first and second preliminary ferroelectric films pHL1 and pHL2 and the first and second preliminary separation films pSL1 and pSL2 may be removed.

The first preliminary ferroelectric film pHL1 remaining in the recess RC may be defined as the first ferroelectric pattern HP1, the second preliminary ferroelectric film pHL2 remaining in the recess RC may be defined as the second ferroelectric pattern HP2, the first preliminary separation film pSL1 remaining in the recess RC may be defined as the first separation pattern SP1, and the second preliminary separation film pSL2 remaining in the recess RC may be defined as the second separation pattern SP2.

Figure 6D:
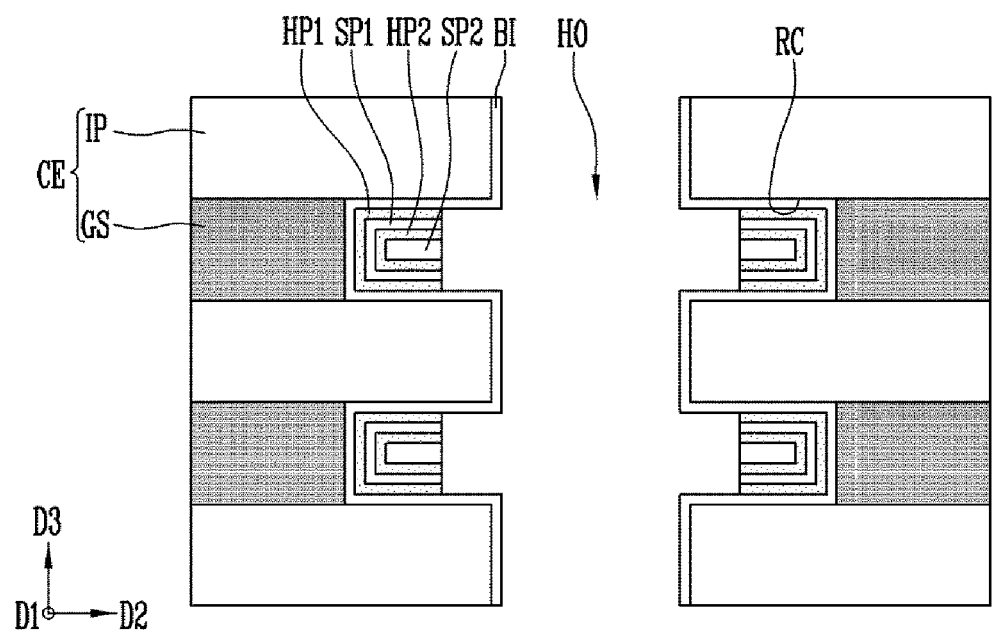

Referring to FIG. 6D, the preliminary blocking film pBI may be oxidized. For example, the preliminary blocking film pBI may be oxidized by supplying oxygen gas on a surface of the preliminary blocking film pBI. The oxidized preliminary blocking film pBI may be defined as the blocking film BI. For example, the blocking film BI may include silicon oxide.

Figure 6E:
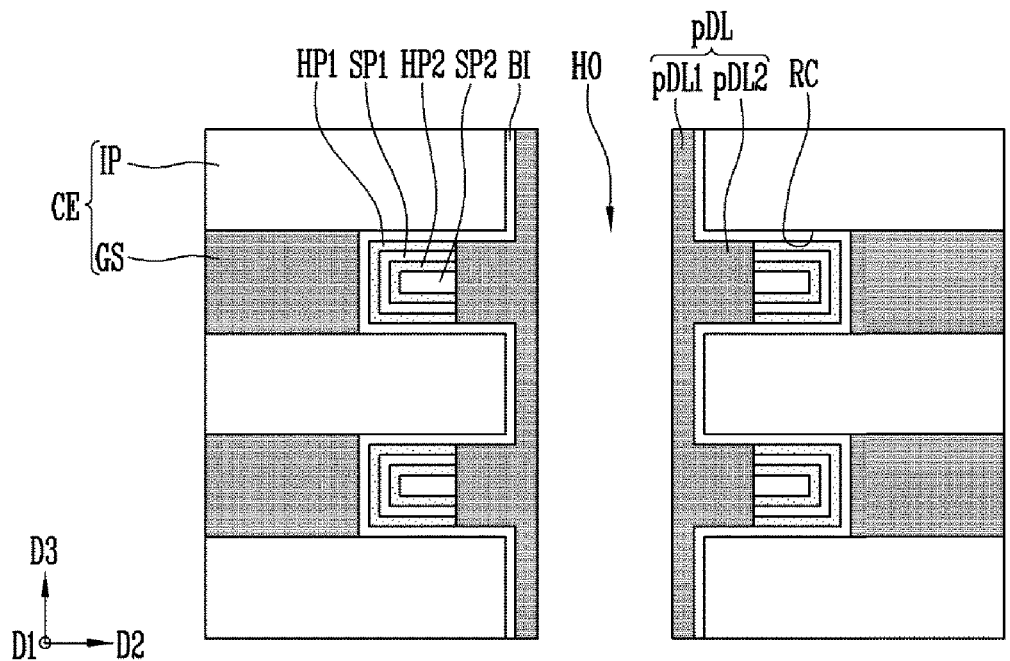

Referring to FIG. 6E, a preliminary storage film pDL may be formed. The preliminary storage film pDL may include a storage cylindrical portion pDL1 and storage protrusion portions pDL2. The storage cylindrical portion pDL1 may extend in the third direction D3 along the through hole HO. The storage cylindrical portion pDL1 may have a hollow cylinder shape. The storage protrusion portion pDL2 may protrude from an outer sidewall of the storage cylindrical portion pDL1. The storage protrusion portions pDL2 may be spaced apart from each other in the third direction D3. The storage protrusion portion pDL2 may protrude between two insulating patterns IP. The storage protrusion portion pDL2 may protrude into the recess RC. The storage protrusion portion pDL2 may have a ring shape. The preliminary storage film pDL may include a material to which a charge may be trapped. For example, the preliminary storage film pDL may include at least one of nitride, silicon, a phase change material, and a nanodot.

Figure 6F:
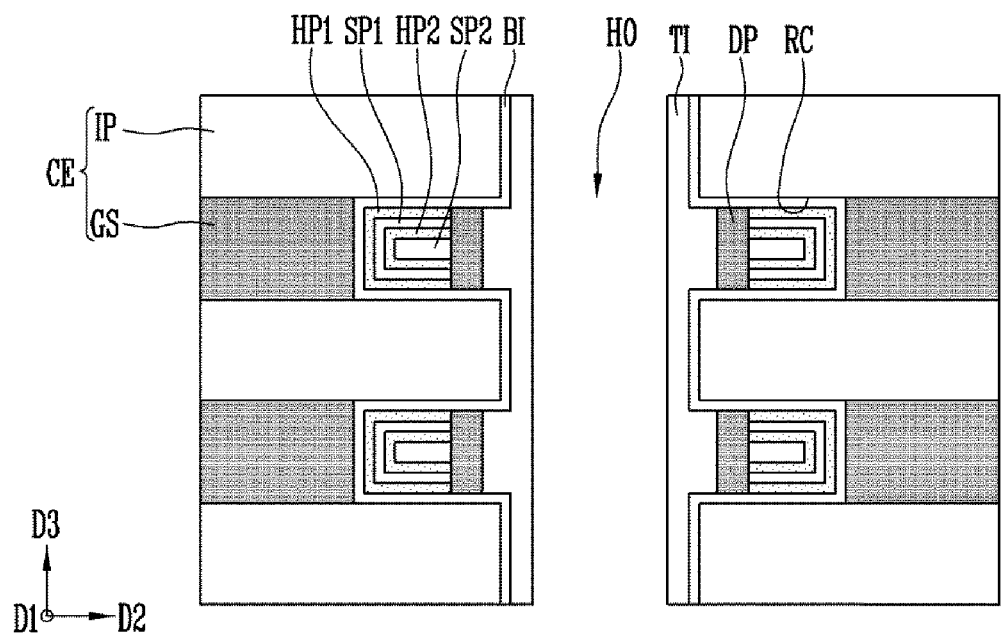

Referring to FIG. 6F, the preliminary storage film pDL may be patterned. All of the storage cylindrical portion pDL1 and a portion of the storage protrusion portion pDL2 of the preliminary storage film pDL may be removed by the patterning of the preliminary storage film pDL. The storage protrusion portion pDL2 remaining in the recess RC may be defined as the storage pattern DP.

Subsequently, the tunnel film TI covering the storage pattern DP and the blocking film BI may be formed.

The channel structure CST may be formed in the tunnel film TI (refer to FIG. 5A). After removing the gate sacrificial patterns GS of the stack CE, the conductive patterns CP may be formed (refer to FIG. 5A). After forming the channel structure CST or forming the conductive pattern CP, the first and second ferroelectric patterns HP1 and HP2 may be heat-treated to crystallize.

Figure 7:
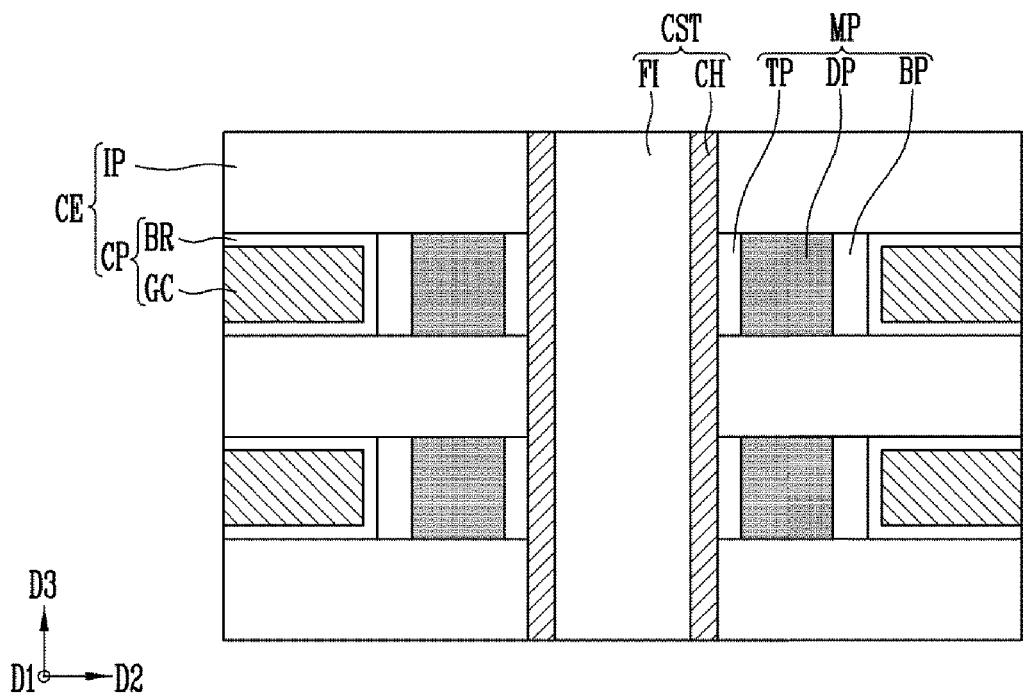
FIG. 7 is a cross-sectional view of a semiconductor memory device according to a sixth embodiment of the present disclosure.

FIG. 7 is a cross-sectional view of a semiconductor memory device according to a sixth embodiment of the present disclosure.

The semiconductor memory device according to the present embodiment may be similar to the semiconductor memory device according to FIGS. 2A and 2B except for the following description.

Referring to FIG. 7, in the semiconductor memory device according to the present comparative example, the memory pattern MP between the channel structure CST and the conductive pattern CP may include the blocking pattern BP, the storage pattern DP, and the tunnel pattern TP. The memory patterns MP may be spaced apart from each other in the third direction D3 by the insulating patterns IP.

In the semiconductor memory device according to the present embodiment, since the storage patterns DP of the memory patterns MP are spaced apart from each other by the insulating patterns IP, interference between the storage patterns DP may be relatively small. However, since the semiconductor memory device according to the comparative example uses only the charge trap characteristic of the storage pattern DP, switching between the threshold voltage distributions of the memory cell may be relatively slow.

Figure 8:
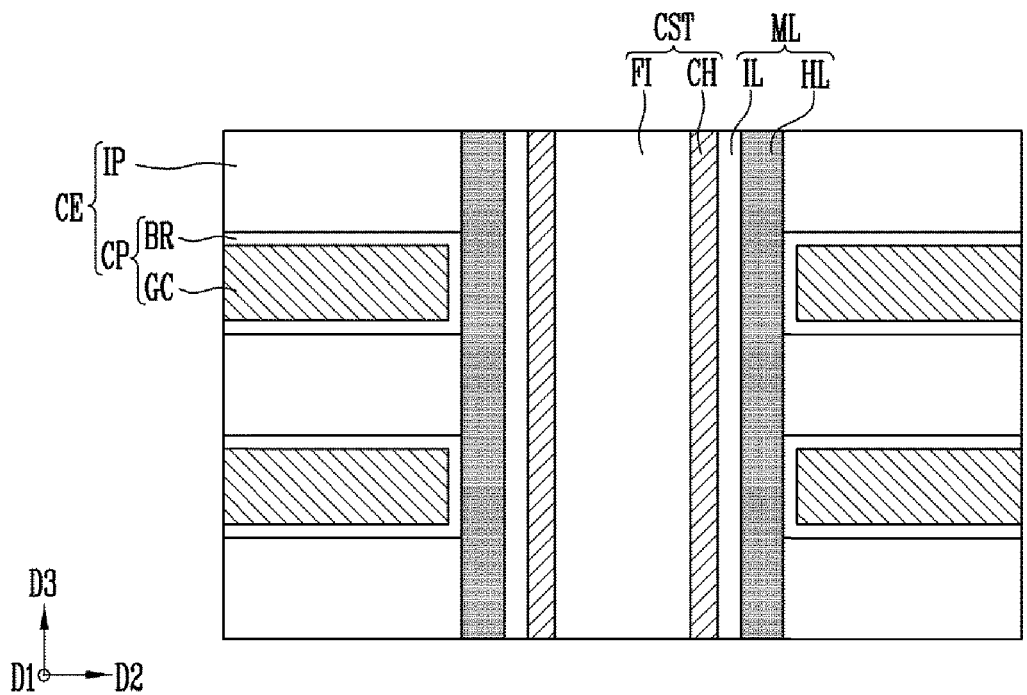
FIG. 8 is a cross-sectional view of a semiconductor memory device according to a seventh embodiment of the present disclosure.

FIG. 8 is a cross-sectional view of a semiconductor memory device according to a seventh embodiment of the present disclosure.

The semiconductor memory device according to the present embodiment may be similar to the semiconductor memory device according to FIGS. 2A and 2B except for the following description.

Referring to FIG. 8, the semiconductor memory device according to the present comparative example may be provided with a memory film ML surrounding the channel structure CST. The memory film ML may include an insulating film IL surrounding the channel structure CST, and a ferroelectric film HL surrounding the insulating film IL.

The semiconductor memory device according to the present embodiment may use a polarization characteristic of the ferroelectric film HL of the memory film ML. Therefore, the switching between the threshold voltage distributions may be relatively fast. However, since the charge trap characteristic is not used, the threshold voltage window may be relatively small.

Figure 9:
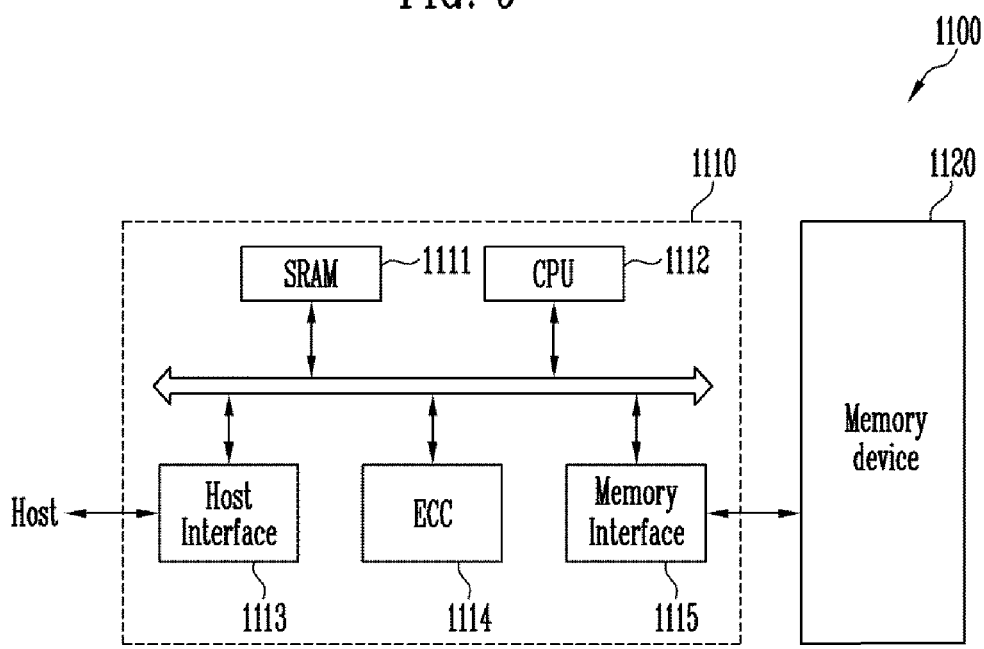
FIG. 9 is a block diagram illustrating a configuration of a memory system according to an embodiment of the present disclosure.

FIG. 9 is a block diagram illustrating a configuration of a memory system according to an embodiment of the present disclosure.

Referring to FIG. 9, the memory system 1100 according to an embodiment of the present disclosure includes a memory device 1120 and a memory controller 1110.

The memory device 1120 may include the structure described with reference to FIGS. 2A and 2B, 3, 4, or 5A and 5B. The memory device 1120 may be a multi-chip package configured of a plurality of flash memory chips.

The memory controller 1110 is configured to control the memory device 1120 and may include a static random access memory (SRAM) 1111, a central processing unit (CPU) 1112, a host interface 1113, an error correction code circuit (ECC) circuit 1114, and a memory interface 1115. The SRAM 1111 is used as an operation memory of the CPU 1112, the CPU 1112 performs all control operations for data exchange of the memory controller 1110, and the host interface 1113 includes a data exchange protocol of a host connected to the memory system 1100. In addition, the ECC circuit 1114 detects and corrects an error included in data read from the memory device 1120 and the memory interface 1115 performs interfacing with the memory device 1120. In addition, the memory controller 1110 may further include a read only memory (ROM) that stores code data for interfacing with the host.

The memory system 1100 described above may be a memory card or a solid state disk (SSD) with which the memory device 1120 and the memory controller 1110 are combined. For example, when the memory system 1100 is an SSD, the memory controller 1110 may communicate with the outside (for example, a host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and integrated drive electronics (IDE).

Figure 10:
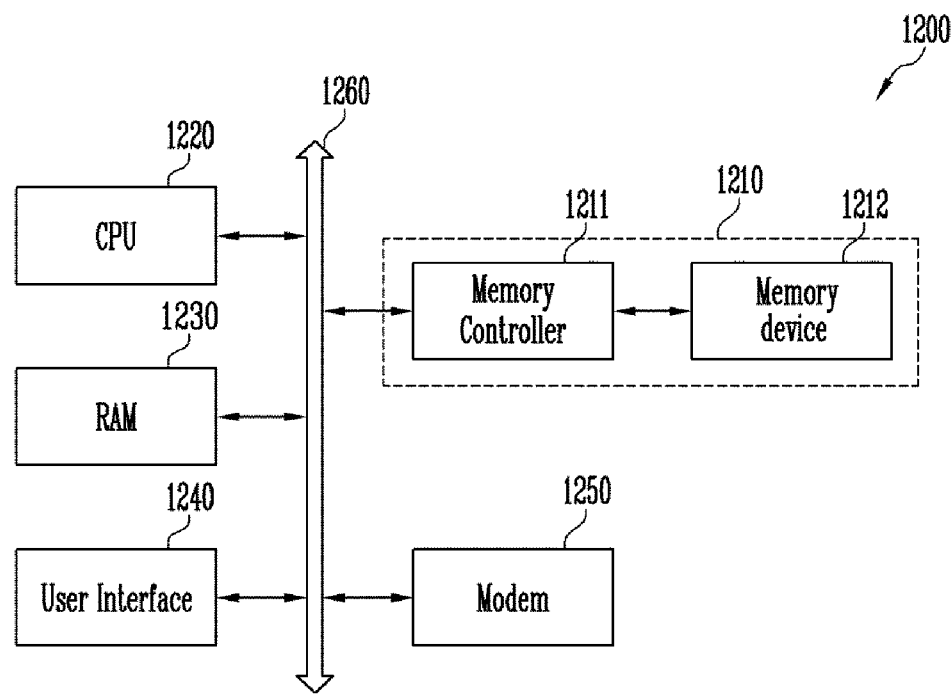
FIG. 10 is a block diagram illustrating a configuration of a computing system according to an embodiment of the present disclosure.

FIG. 10 is a block diagram illustrating a configuration of a computing system according to an embodiment of the present disclosure.

Referring to FIG. 10, the computing system 1200 according to an embodiment of the present disclosure may include a CPU 1220, a random access memory (RAM) 1230, a user interface 1240, a modem 1250, and a memory system 1210, which are electrically connected to a system bus 1260. In addition, when the computing system 1200 is a mobile device, a battery for supplying an operation voltage to the computing system 1200 may be further included, and an application chipset, a camera image processor (CIS), a mobile DRAM, and the like may be further included.

The memory system 1210 may include a memory device 1212 and a memory controller 1211. The memory device 1212 and the memory controller 1211 may be configured as the memory device 1120 and the memory controller 1110 as described with reference to FIG. 9.

The embodiments described above are merely examples for describing the technical spirit of the present disclosure and facilitating understanding of the technical spirit of the present disclosure and do not limit the scope of the present disclosure. It is apparent to a person skilled in the art to which the present disclosure pertains that other modification examples based on the technical spirit of the present disclosure may be carried out in addition to the embodiments disclosed herein.

What is claimed is:

1. A method of operating a semiconductor memory device, in a program operation of a memory cell comprising a conductive pattern, a channel structure, and a storage pattern and a ferroelectric pattern between the conductive pattern and the channel structure, the ferroelectric pattern including a plurality of domains having different crystal structures, the method comprising:
    applying a program voltage to the conductive pattern so that a charge is trapped in the storage pattern; and
    applying a polarization change voltage to the conductive pattern so that the ferroelectric pattern has various polarization orientations.

2. The method of claim 1, wherein a threshold voltage of the memory cell is determined by a direction of the polarization orientations changed according to the polarization change voltage.

3. The method of claim 1, wherein the polarization change voltage forms residual polarizations in the domains so that each of the domains has the polarization orientations of different directions.

4. A method of operating a semiconductor memory device, in a program operation of a memory cell comprising a conductive pattern, a channel structure, and a storage pattern and a ferroelectric pattern between the conductive pattern and the channel structure, the ferroelectric pattern including first and second domains having different crystal structures, the method comprising:
    applying a program voltage to the conductive pattern so that a charge is trapped in the storage pattern; and
    applying a first polarization change voltage to the conductive pattern to change a polarization orientation of the first and second domains.

5. The method of claim 4, wherein the program voltage has a positive voltage, and
    the first polarization change voltage has a positive voltage or a negative voltage.

6. The method of claim 5, wherein an absolute value of the first polarization change voltage is smaller than an absolute value of the program voltage.

7. The method of claim 4, further comprising:
    applying a second polarization change voltage to the conductive pattern to change the polarization orientation of the first and second domains again.

8. A method of operating a semiconductor memory device, in a program operation of a memory cell comprising a conductive pattern, a channel structure, and a storage pattern and a ferroelectric pattern between the conductive pattern and the channel structure, the ferroelectric pattern and the storage pattern in direct contact with each other, the ferroelectric pattern including a plurality of domains having different crystal structures, the method comprising:
    applying a program voltage to the conductive pattern so that a charge is trapped in the storage pattern; and
    applying a polarization change voltage to the conductive pattern so that the ferroelectric pattern has various polarization orientations.

9. The method of claim 8, wherein a threshold voltage of the memory cell is determined by a direction of the polarization orientations changed according to the polarization change voltage.

10. The method of claim 8, wherein the polarization change voltage forms residual polarizations in the domains so that each of the domains has the polarization orientations of different directions.

11. A method of operating a semiconductor memory device, in a program operation of a memory cell comprising a conductive pattern, a channel structure, and a storage pattern and a ferroelectric pattern between the conductive pattern and the channel structure, the ferroelectric pattern and the storage pattern in direct contact with each other, the ferroelectric pattern including first and second domains having different crystal structures, the method comprising:
   applying a program voltage to the conductive pattern so that a charge is trapped in the storage pattern; and
   applying a first polarization change voltage to the conductive pattern to change a polarization orientation of the first and second domains.

12. The method of claim 11, wherein the program voltage has a positive voltage, and
   the first polarization change voltage has a positive voltage or a negative voltage.

13. The method of claim 12, wherein an absolute value of the first polarization change voltage is smaller than an absolute value of the program voltage.

14. The method of claim 11, further comprising:
   applying a second polarization change voltage to the conductive pattern to change the polarization orientation of the first and second domains again.

\* \* \* \* \*